United States Patent
Kim et al.

(10) Patent No.: US 12,512,793 B2
(45) Date of Patent: Dec. 30, 2025

(54) POWER AMPLIFIER DEVICE HAVING VERTICAL DIE INTERCONNECT STRUCTURE

(71) Applicant: NXP USA, Inc., Austin, TX (US)

(72) Inventors: Kevin Kim, Chandler, AZ (US); Vikas Shilimkar, Chandler, AZ (US); Joseph Gerard Schultz, Wheaton, IL (US)

(73) Assignee: NXP USA, INC., Austin, TX (US)

( * ) Notice: Subject to any disclaimer, the term of this patent is extended or adjusted under 35 U.S.C. 154(b) by 517 days.

(21) Appl. No.: 18/054,971

(22) Filed: Nov. 14, 2022

(65) Prior Publication Data

US 2024/0162861 A1 May 16, 2024

(51) Int. Cl.
*H03F 1/02* (2006.01)
*H01L 23/66* (2006.01)

(52) U.S. Cl.
CPC ........... *H03F 1/0288* (2013.01); *H01L 23/66* (2013.01); *H01L 2223/6655* (2013.01); *H03F 2200/451* (2013.01)

(58) Field of Classification Search
CPC . H03F 1/0288; H03F 2200/451; H01L 23/66; H01L 2223/6655
USPC ......................................................... 330/295
See application file for complete search history.

(56) References Cited

U.S. PATENT DOCUMENTS

| | | |
|---|---|---|
| 6,724,079 B2 | 4/2004 | Viswanathan et al. |
| 6,844,221 B2 | 1/2005 | Viswanathan et al. |
| 9,013,246 B2 | 4/2015 | Holmes et al. |
| 9,202,782 B2 | 12/2015 | Chuah |
| 9,252,085 B2 | 2/2016 | Weinschenk |
| 9,986,646 B2 | 5/2018 | Viswanathan et al. |
| 10,784,149 B2 | 9/2020 | Costa et al. |
| 10,903,182 B1 | 1/2021 | Wang et al. |

(Continued)

FOREIGN PATENT DOCUMENTS

| | | | |
|---|---|---|---|
| EP | 3264455 A1 * | 1/2018 | ............... G01K 7/01 |
| EP | 3376535 A1 | 9/2018 | |
| EP | 3982406 A2 | 4/2022 | |

OTHER PUBLICATIONS

U.S. Appl. No. 17/823,122 Notice of Allowance issued Apr. 2, 2025, 7 pages.

(Continued)

*Primary Examiner* — Hafizur Rahman
(74) *Attorney, Agent, or Firm* — Sherry W. Gourlay

(57) ABSTRACT

A power amplifier device includes a transistor die with an elongated bondpad coupled to a terminal of an integrated transistor. The device also includes a substrate formed from a stack of alternating dielectric and patterned conductive layers. An elongated die contact is exposed at a first substrate surface and is attached to the elongated bondpad to provide a uniform connection between the die contact and the elongated bondpad. A vertical interconnect structure is connected to the die contact and extends towards the second substrate surface. A circuit includes passive component(s) coupled to the second substrate surface and to the vertical interconnect structure. An encapsulation material layer covers the passive component(s) and the second substrate surface. A plurality of device interconnects are coupled to the substrate, electrically coupled to the power transistor die, and exposed at a contact surface of the power amplifier device.

22 Claims, 17 Drawing Sheets

(56) References Cited

U.S. PATENT DOCUMENTS

| | | |
|---|---|---|
| 11,190,146 B2 | 11/2021 | Srinidhi Embar et al. |
| 2002/0074146 A1 | 6/2002 | Okubora |
| 2003/0165052 A1 | 9/2003 | Negishi et al. |
| 2008/0315398 A1 | 12/2008 | Lo et al. |
| 2010/0155931 A1 | 6/2010 | Ray et al. |
| 2014/0070397 A1 | 3/2014 | Viswanathan et al. |
| 2018/0159479 A1 | 6/2018 | Wu et al. |
| 2019/0088621 A1 | 3/2019 | Yang et al. |
| 2020/0027814 A1 | 1/2020 | Ichiryu et al. |
| 2020/0203291 A1 | 6/2020 | Uejima |
| 2021/0075374 A1 | 3/2021 | Wang et al. |
| 2021/0111091 A1 | 4/2021 | Uppal et al. |
| 2021/0175854 A1 | 6/2021 | Hue et al. |
| 2021/0313282 A1 | 10/2021 | Noori et al. |
| 2021/0313284 A1 | 10/2021 | Noori et al. |
| 2021/0313285 A1* | 10/2021 | Noori ................ H01L 23/49861 |
| 2021/0313293 A1* | 10/2021 | Noori .................... H01L 23/047 |
| 2022/0115301 A1 | 4/2022 | Bowers et al. |

OTHER PUBLICATIONS

Dinulovic et al.: "Power Microtransformer on Silicon Embedded into PCB", 2021 Third International Symposium on 3D Power Electronics Integration and Manufacturing (3D-PEIM), Conference Paper—Publisher: IEEE, 2021, 4 pages.

Kuo et al: "High Efficiency Power Electronic Module with Embedded Die", 2016 IEEE CPMT Symposium Japan (ICSJ), Conference Paper, Publisher IEEE, 2016, 4 pages.

Mark Lapedus "Embedded Die Packaging Emerges", Semiconductor Engineering, Apr. 9, 2018, 15 pages.

U.S. Appl. No. 17/823,116, filed Aug. 30, 2022, 53 pages.

U.S. Appl. No. 17/823,122, filed Aug. 30, 2022, 57 pages.

U.S. Appl. No. 17/823,127, filed Aug. 30, 2022, 62 pages.

U.S. Appl. No. 17/823,116 Notice of Allowance issued on Apr. 4, 2025, 7 pages.

U.S. Appl. No. 17/823,127 Non Final OA issued on Jul. 29, 2025; 27 pages.

* cited by examiner

POWER AMPLIFIER DEVICE HAVING VERTICAL DIE INTERCONNECT STRUCTURE

TECHNICAL FIELD OF THE INVENTION

The present invention relates generally to power amplifiers that are packaged in semiconductor device packages.

BACKGROUND OF THE INVENTION

Wireless communication systems employ power amplifiers for increasing the power of radio frequency (RF) signals. Power amplifiers may be implemented in various ways, with a majority of power amplifiers being implemented on a printed circuit board (PCB). Circuit board implementations of power amplifiers may include, for example, input/output (I/O) connectors (e.g., coax connectors), surface mount components coupled to the surface of the PCB, and printed traces on the PCB that interconnect the connectors and the surface mount components.

In some cases, the primary amplification portion of a power amplifier includes one or more transistor dies. The transistor die(s) may be coupled to a PCB, along with I/O terminals, various surface mount components, and planar transmission lines. In some amplifiers, the transistor dies may include elongated bondpads at the input and/or output of the dies (i.e., bondpads having a length that is significantly greater than a width). Wirebond arrays are used to electrically connect the bondpads of the transistor die(s) to the planar transmission lines, and the planar transmission lines function to convey signals and voltages between the various die(s), components, and I/O terminals.

One issue with using wirebond arrays to connect the elongated die bondpads to the planar transmission lines is that it is difficult to achieve uniform power distribution across the length of the elongated bondpad(s). This is especially the case when, for example, a bondpad needs to be coupled through multiple wirebond arrays to more than one planar transmission line on the PCB (and thus to more than one circuit). For example, an output bondpad of a transistor die may be coupled to an output transmission line on the PCB using a first wirebond array, and the output bondpad also may be coupled to another transmission line and circuit using a second wirebond array. The two wirebond arrays may be implemented side-by-side (e.g., the two wirebond arrays may be coupled to separate but adjacent portions of the output bondpad). Because both of the wirebond arrays cannot be fully distributed along the entire length of the output bondpad, it may not be possible to achieve uniform power distribution across the length of the bondpad. This may result in sub-optimal performance, including limitations on maximum output power, gain, and efficiency. Accordingly, power amplifier designs are needed that overcome these issues.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
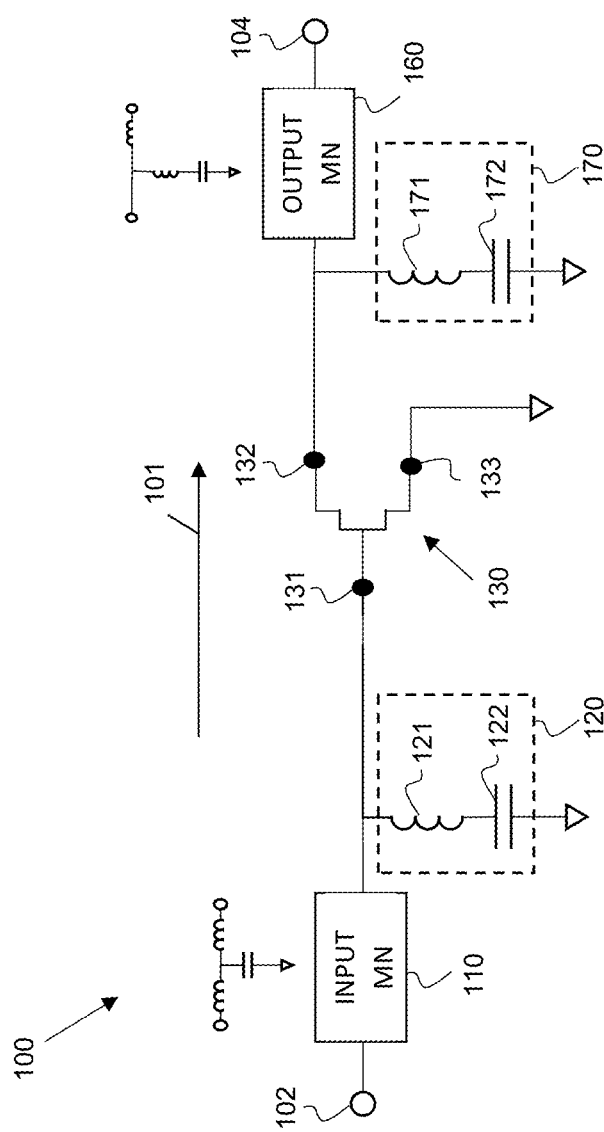
FIG. 1 is a simplified circuit diagram of a power amplifier, according to an embodiment.

Embodiments of power amplifiers described herein reduce or eliminate wirebond arrays from an amplifier circuit, including elimination of wirebond arrays that are used in conventional amplifiers to electrically connect to the input and output bondpads of power transistor dies. Instead, in various embodiments, a "three dimensional" interconnect system is used to connect power transistor die bondpads to each other and to other amplifier circuitry. Besides enabling more uniform power distribution along the lengths of the power transistor die bondpads, elimination of wirebond arrays may provide for increased amplifier power and efficiency, and minimized inductances that may enable higher frequency operation. In addition, embodiments of power amplifiers described herein may facilitate miniaturization of RF amplifiers, which increasingly is becoming a critical aspect of power amplifier designs. Further still, in embodiments in which wirebond arrays are eliminated completely, the expensive wirebond assembly steps and wirebonder equipment may be eliminated, as well.

An embodiment of a power amplifier device includes at least one power transistor die and a substrate. The power transistor die includes a bondpad that is elongated along a first axis and an integrated transistor with a terminal that is coupled to the elongated bondpad. The substrate is formed from a stack of multiple dielectric layers and multiple patterned conductive layers in an alternating arrangement, and a plurality of conductive vias electrically coupling portions of the conductive layers. The substrate includes an elongated die contact exposed at a first substrate surface and connected to the elongated bondpad. The substrate also includes a vertical interconnect structure connected between the elongated die contact and a second surface of the substrate. The vertical interconnect structure extends in a direction that is perpendicular to the first substrate surface. Various circuits may be coupled to the vertical interconnect structure, and the circuit connections may extend in directions that are perpendicular to the vertical interconnect structure.

The power amplifier device embodiments described herein may be used to implement various types of amplifiers. Embodiments may be well suited for amplifiers that include a single power transistor die or multiple power transistor dies, each associated with an amplification stage (e.g., amplifiers with a series-coupled pre-amplifier and final stage amplifier). The embodiments also may be well suited for single-path amplifiers and multiple-path amplifiers (e.g., a multi-path amplifier with a main (or primary) amplifier and one or more auxiliary amplifiers implemented in series or parallel). For purpose of example, some of the below-described embodiments will be described in the context of a Doherty power amplifier, which is one non-limiting example of a multi-path amplifier in which the invention may be practiced. In fact, use of the below-described embodiments to provide a Doherty power amplifier may result in significant improvements in Doherty power amplifier performance and/or significantly reduced size.

First, a schematic of a single-path, single-stage power amplifier will be described in order to provide adequate context for the description of some of the various embodiments. More specifically, FIG. 1 is a simplified circuit diagram of a single-path, single-stage power amplifier 100, according to an embodiment, which may be at least partially embodied in an amplifier device, as discussed later. Amplifier 100 includes an input terminal 102, an output terminal 104, and an amplifier path 101 extending between the input and output terminals 102, 104. According to an embodiment, the amplifier path 101 includes an input impedance matching network 110 ("INPUT MN"), an input-side shunt circuit 120, a power transistor 130 (i.e., a single amplification stage), an output-side shunt circuit 170, and an output impedance matching network 160 ("OUTPUT MN"). In various embodiments, one or more of the input or output impedance matching networks 110, 160 and/or the input-side or output-side shunt circuits 120, 170 may be excluded from the circuit 100 (and thus from a device that embodies the circuit 100).

An input RF signal received at input terminal 102 is conveyed through the input impedance matching network 110 to the input terminal 131 (e.g., the gate terminal) of the power transistor 130. The input impedance matching network 110 may be used to transform the gate impedance of power transistor 130 to a more desirable system level impedance. For example, but not by way of limitation, the input impedance matching network 110 may include a T-match circuit (e.g., a low pass filter), as shown above box 110. Other impedance matching topologies alternatively may be implemented.

Shunt circuit 120 is coupled between the input terminal 131 of the power transistor 130 and a ground reference node. According to an embodiment, shunt circuit 120 is a series inductor-capacitor (LC) circuit formed from an inductance 121 coupled in series with a capacitor 122. Amplifier 100 is configured to operate at a center frequency of operation, f0 (also referred to as a fundamental frequency of operation). According to an embodiment, shunt circuit 120 is a harmonic frequency termination circuit, which is configured to provide a low impedance path to ground for signal energy at the second harmonic of the center frequency of operation, 2fo, of the amplifier 100. In other embodiments, shunt circuit 120 may have another function. For example shunt circuit 120 may form a portion of the input matching network. Alternatively, shunt circuit 120 may be a "shunt-L" circuit in which capacitor 122 is a DC blocking capacitor, and additional circuitry (e.g., baseband decoupling circuitry), not illustrated, may be coupled to the node between inductance 121 and capacitor 122.

Power transistor 130 is implemented within a power transistor integrated circuit (IC) (or power transistor die), and is configured to amplify an RF signal conducted through the amplifier path 101. As shown in FIG. 1, amplifier path 101 includes a single-stage amplifier in the form of power transistor 130. In alternate embodiments, however, amplifier path 101 may include a two-stage amplifier with a pre-amplifier stage and a final amplifier stage. In such embodiments, the pre-amplifier and final amplifier stages may be integrated into a single power transistor IC (or "power transistor die"), or the pre-amplifier and final amplifier stages may be integrated into two separate power transistor ICs.

Power transistor 130 includes an input terminal 131 (e.g., a gate terminal), a first current conducting terminal 132 (e.g., a drain terminal or output terminal), and a second current conducting terminal 133 (e.g., a source terminal). According to various embodiments, transistor 130 may be implemented, for example, using a III-V field effect transistor (e.g., a HEMT), such as a gallium nitride (GaN) field effect transistor (FET) (or another type of III-V transistor, including a GaAs FET, a GaP FET, an InP FET, or an InSb FET), a silicon-based FET (e.g., an LDMOS FET) or a silicon germanium (SiGe) FET, or other types of transistors.

An amplified RF signal produced at the output terminal 132 is conveyed through an output impedance matching network 160 to the output terminal 104. The output impedance matching network 160 may be used to transform the drain impedance of power transistor 130 to a more desirable system level impedance. For example, but not by way of limitation, the output impedance matching network 160 also may include a T-match circuit (e.g., a low pass filter), as shown above box 160. Other impedance matching topologies alternatively may be implemented.

Shunt circuit 170 is coupled between the output terminal 132 of the power transistor 130 and a ground reference node. According to an embodiment, shunt circuit 170 is a series LC circuit formed from an inductance 171 coupled in series with a capacitor 172. According to an embodiment, shunt circuit 170 is a harmonic frequency termination circuit, which is configured to provide a low impedance path to ground for signal energy at the second harmonic frequency.

In other embodiments, shunt circuit 170 may have another function. For example shunt circuit 170 may form a portion of the output matching network. Alternatively, shunt circuit 170 may be a "shunt-L" circuit in which capacitor 172 is a DC blocking capacitor, and additional circuitry (e.g., baseband decoupling circuitry), not illustrated, may be coupled to the node between inductance 171 and capacitor 172.

Transistor 130, shunt circuits 120, 170, and matching networks 110, 160 all may be implemented in a discrete, packaged power amplifier device, in accordance with various embodiments. In such devices, the input and output terminals 102, 104 are coupled to corresponding pads on a system substrate (e.g., a PCB). The shunt circuits 120, 170 and the input and output matching networks 110, 160 also may be implemented as additional components within the packaged amplifier. Baseband decoupling circuits, bias circuits, and other circuits also may be implemented as additional components within the packaged amplifier device.

Figures 2A, 2B:
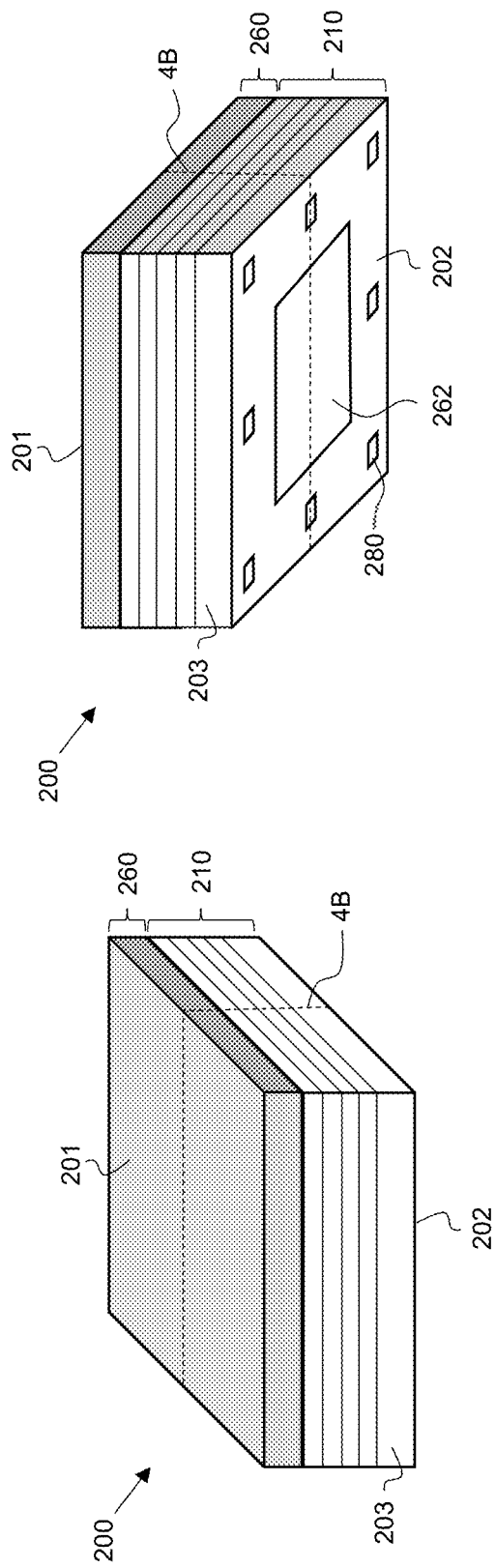
FIGS. 2A and 2B are perspective views showing the top and bottom surfaces, respectfully, of a power amplifier device, according to an example embodiment.

Turning now to FIGS. 2A and 2B (referred to collectively as FIG. 2), an embodiment of a power amplifier device 200 is depicted. More specifically, FIGS. 2A and 2B are perspective views showing the upper and lower surfaces 201, 202, respectfully, of a power amplifier device 200, according to an example embodiment. The power amplifier device 200 includes circuitry for a power amplifier, such as but not limited to single-path power amplifier 100, FIG. 1 or the later described Doherty power amplifier 800, FIG. 8.

The power amplifier device 200 has a device body shaped as a rectangular prism. The device body, and thus the device 200, is defined by a first device surface 201 (referred to herein as the upper device surface) and an opposed second device surface 202 (referred to herein as the lower device surface or the contact surface). Four device sidewalls (e.g., sidewall 203) extend between the upper and lower device surfaces 201, 202.

The device body includes an encapsulation material layer 260 connected to a substrate 210. The substrate 210, which partially defines the lower device surface 202 in some embodiments, is formed from a stack of multiple dielectric layers and multiple patterned conductive layers in an alternating arrangement. As will be discussed in more detail later in conjunction with FIGS. 4A-C, 5-7, 9A-C, and 10, one or more power transistor dies (e.g., dies 430, 930, 931, FIGS. 4A-C, 5-7, 9A-C, and 10) are connected to substrate die contacts (e.g., contacts 445, 448, 938, 939, 994, 995, FIGS. 4A-C, 5-7, 9A-C, and 10) exposed at a first surface of the substrate 210 (e.g., substrate surface 411, 911, FIGS. 4B-C, 9B-C). In some embodiments, the first substrate surface is recessed below the lower device surface 202, and a thermal structure 262 contacts the embedded die(s) and extends outward to define a portion of the lower device surface 202. In other embodiments, the first substrate surface is covered by a second encapsulation material layer (not illustrated), which defines the lower device surface 202.

According to an embodiment, a plurality of conductive interconnects 280 (or "device interconnects") have distal ends exposed at the lower device surface 202. The conductive interconnects 280 extend into the device body, and their proximal ends are connected to additional substrate contacts and/or to the patterned conductive layers of the substrate 210. Essentially, the conductive interconnects 280 function as terminals configured to receive and convey RF signals, bias voltages, and ground connections to the amplifier circuitry (e.g., dies, surface mount, and flip-chip components) embedded within the die body.

In addition, one or more surface mount components (e.g., components 471, 472, 660, 720, 971, 972, FIGS. 4A-C, 5-7, 9A-C, and 10) are connected to additional substrate contacts or traces (e.g., conductive features 473, 474, 475, 449, 575, 673, 674, 675, 685, 709, 716, 749, 773, 774, 775, 973, 974, 975, FIGS. 4A-C, 5-7, 9A-C, and 10) that are exposed at a second surface of the substrate 210 (e.g., substrate surface 412, 912, FIGS. 4A-C, 5-7, 9A-C, and 10). The encapsulation material layer 260 covers the surface mount components and the second substrate surface, and substantially defines the upper device surface 201. As used herein, the term "surface mount component" includes any kind of discrete, multi-terminal component that is suitable for connecting to the upper surface of a substrate, including small discrete passive components, integrated passive components, and larger flip-chip components.

As mentioned above in conjunction with FIG. 1, an amplifier stage may be implemented with a power transistor integrated in a semiconductor die (i.e., a "power transistor die"). Whether a single power transistor/amplifier stage is implemented in a die, or two power transistors/amplifier stages are implemented in a die (e.g., a pre-amplifier stage in series with a final amplifier stage), each die has an input bondpad (e.g., input bondpad 340, FIG. 3) coupled to a control terminal (e.g., gate terminal) of a power transistor within the die, and an output bondpad (e.g., output bondpad 342, FIG. 3) coupled to a current-conducting terminal (e.g., drain terminal) of a power transistor within the die.

Figure 3:
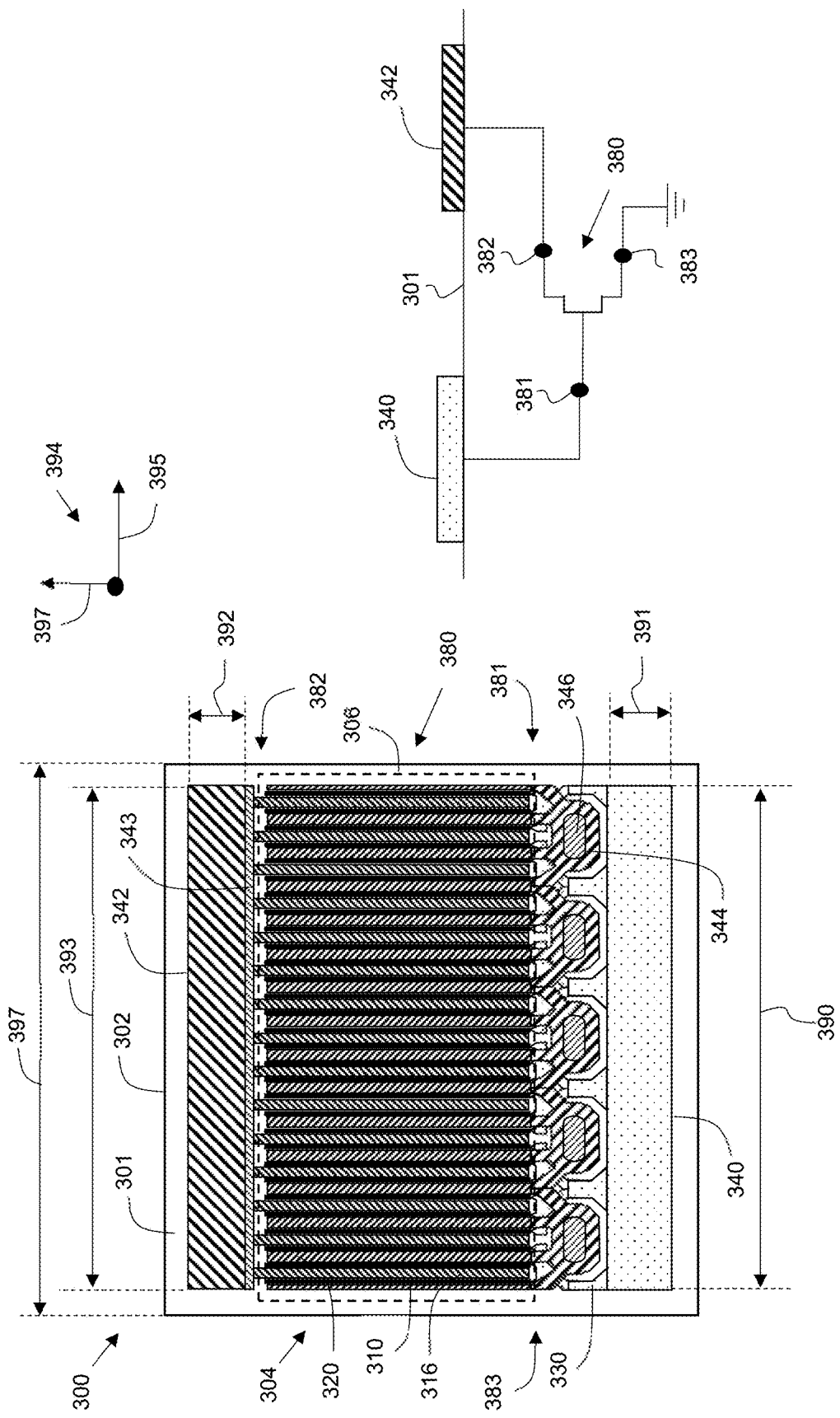
FIG. 3 is a top view of a power transistor die with elongated input and output bondpads, according to an example embodiment.

FIG. 3 is a top view of a power transistor die 300 that is suitable for use in an embodiment of a power amplifier device (e.g., devices 200, 400, 400', 500, 600, 700, 900, 900', 900", 1000, FIGS. 4A-C, 5-7, 9A-C, 10, and 13), according to an example embodiment. More particularly, power transistor die 300 is a single-stage power transistor die that includes one integrated transistor/amplifier stage. As noted above, in alternate embodiments, a power transistor die may include a pre-amplifier stage coupled in series with a final amplifier stage.

Power transistor die 300 essentially is a multi-layer circuit integrated within a semiconductor die 302. FIG. 3 shows a view through an upper surface 301 of the die 302. It should be understood that some of the elements shown in FIG. 3 (e.g., bondpads 340, 342) are exposed at the upper surface 301 of the die 302, while other elements are buried below one or more dielectric layers (e.g., gate fingers 310, drain fingers 316, and source fingers 320), and thus may not be visible in an actual top view. Further, although some of the conductive features of die 300 are shown to overlap each other in the top view of FIG. 3, it should be understood that dielectric layers may be present between some of the overlapping features to ensure that the features are not shorted together (e.g., dielectric material would be present between gate conductors 330 and source conductors 344).

The semiconductor die 302 includes a semiconductor substrate composed of a base semiconductor substrate and a build-up structure coupled to the top surface of the base semiconductor substrate. The base semiconductor substrate may be formed, for example, from bulk or composite semiconductor materials (e.g., Si, GaN, GaAs, silicon-on-insulator (SoI), GaN-on-insulator (e.g., GaN on Si, GaN on silicon carbide, GaN on sapphire, and so on), or other suitable materials). The build-up structure is built up onto a surface of the base semiconductor substrate, and includes multiple dielectric layers that separate multiple patterned conductive layers, along with conductive vias that electrically connect portions of the conductive layers.

Power transistor die 300 includes an active region 304 formed in the substrate 302 between an input side of the die (bottom side in FIG. 3) and an output side of the die (top side in FIG. 3). The active region 304 is bounded by an outer periphery 306, enclosed in FIG. 3 with a dashed line box. The various structures and semiconductor regions within active region 304 constitute an integrated power transistor 380, and an electrical model of the power transistor 380 is shown on the right side of FIG. 3. Essentially, the power transistor 380 is a three-terminal transistor with a gate terminal 381 (also referred to as an input terminal or a control terminal), a drain terminal 382 (also referred to as an output terminal or a first current-carrying terminal), and a source terminal 383 (also referred to as a second current-carrying terminal).

In the semiconductor device 300, the transistor itself is implemented with a plurality of parallel doped semiconductor regions (e.g., drain and source fingers 316, 320) in the base substrate, and a plurality of gate structures (e.g., gate fingers 310) in the build-up structure. More specifically, the transistor includes sets of interdigitated input gate fingers 310 (indicated with thick black vertical lines), output drain fingers 316 (indicated with vertical rectangles, which are cross-hatched from bottom left to top right), and common source fingers 320 (indicated with vertical rectangles, which are cross-hatched from top left to bottom right). The gate, drain, and source fingers 310, 316, 320 are disposed within substrate 302 in an interleaved configuration, and are oriented substantially parallel to one another with their lengths extending parallel to axis 397 in coordinate system 394. In alternate embodiments, a transistor may include more or fewer gate fingers, drain fingers, and source fingers than the numbers shown in FIG. 3.

The collective input-side ends of the gate fingers 310 represent the gate terminal 381, the collective output-side ends of the drain fingers 316 represent the drain terminal 382, and the collective input-side ends of the source fingers 320 represent the source terminal 383. Accordingly, the gate terminal 381 is coupled to the gate fingers 310, the drain terminal 382 is coupled to the drain fingers 316, and the source terminal 383 is coupled to the source fingers 320.

The gate and drain terminals 381, 382, in turn, are coupled to gate and drain bondpads 340, 342, respectively, that are exposed at the upper surface 301 of the die 302, also referred to as the "contact surface" 301 of the die 302. More specifically, the input-side ends of the gate fingers 310 are coupled to the gate bondpad 340 through a series of gate conductors 330 (shaded with a stippled pattern), and the output-side ends of the drain fingers 316 are coupled to the drain bondpad 342 through a drain manifold 343.

In contrast, the source terminal 383 is coupled to a conductive bottom layer (e.g., layer 433, 933, 936, FIGS. 4B-C, 9B-C, 10 and 13) of the die 300, and the conductive bottom layer defines a lower surface of the die 300. More specifically, the input-side ends of the source fingers 320 are coupled through a series of source conductors 344 and through substrate vias 346 (herein "source TSVs") to the above-mentioned conductive layer on the lower surface of the die 300. In the illustrated embodiment, the source TSV 346 are disposed between the active area 304 and the gate bondpad 340. The layout of power transistor die 300 thus represents an "end via" layout in which source TSVs 346 are placed outside the bounding box (outer periphery 306) defined by the active region 304. In other embodiments, the source TSVs 346 may be placed within the active region 304 (e.g., between various fingers) or may be placed between the active region 304 and the drain bondpad 342.

The gate bondpad 340 is positioned outside of the outer periphery 306 of the active region 304 at an input side of the die 300, and the drain bondpad 342 is positioned outside of the outer periphery 306 of the active region 304 at an output side of the die 300. Both the gate and drain bondpads 340, 342 are exposed at a contact surface of the power transistor die 300 (i.e., an outer surface that is planar and parallel with axes 395, 397).

It is important to note at this point that an important feature of power transistor die 300 is that the gate and drain bondpads 340, 342 (or input and output bondpads) each are "elongated," meaning that their bondpad lengths 390, 393, respectively, are significantly greater than their bondpad widths 391, 392, respectively. As used herein, the "length" or "bondpad length" of a gate or drain bondpad 340, 342 is a bondpad dimension that is parallel to a first axis (e.g., axis 395 of Cartesian coordinate system 394). Accordingly, the gate and drain bondpads 340, 342 are elongated along the first axis, which in turn is parallel to the contact surface of the power transistor die 300. It may be noted that the length dimension of the gate or drain bondpad 340, 342) is perpendicular to the length dimensions of the gate, drain, and source fingers 310, 316, 320, which extend parallel to a second axis (e.g., axis 397 of coordinate system 394). In other words, the length dimensions of the gate and drain bondpads 340, 342 are perpendicular to the length dimensions of the gate, drain, and source fingers 310, 316, 320. According to an embodiment, for example, a length 390 of the gate bondpad 340 may be at least five times greater than a width 391 of the gate bondpad 340. Similarly, a length 393 of the drain bondpad 342 may be at least five times greater than a width 392 of the drain bondpad 342. In other embodiments, the lengths 390, 393 may be at least ten times greater than the widths 391, 392 of the gate and drain bondpads 340, 342. According to another embodiment, the term "elongated," with respect to the lengths of each gate and drain bondpad 340, 342, means that the length of each bondpad is at least 50 percent of the width 397 of the die 300. Essentially, the gate bondpad 340 is elongated along a first axis (e.g., an axis parallel to axis 395), and the drain bondpad 342 is elongated along a second axis (e.g., another axis that is parallel to axis 395). In the illustrated embodiments, the first and second axes are parallel to each other, as well. In other embodiments, the first and second axes may be orthogonal or otherwise not parallel.

The importance of the elongated bondpad feature will become apparent in the description of how the power transistor die 300 is incorporated into a power amplifier device (e.g., device 200, FIG. 2). Briefly, the elongated gate and drain bondpads 340, 342 enable the power transistor die 300 to be coupled to a substrate which, in turn, has elongated contacts (e.g., contacts 445, 484, 938, 939, 994, 995, FIGS. 4A-C, 5-7, 9A-C, 10). Essentially, the elongated substrate contacts may connect across the entire lengths or large portions of the entire lengths of the elongated gate and drain bondpads 340, 342. This enables more uniform power distribution across the length of the bondpads 340, 342, which may, in turn, result in increased performance, including improvements in maximum output power, gain, and efficiency.

Figure 4A:
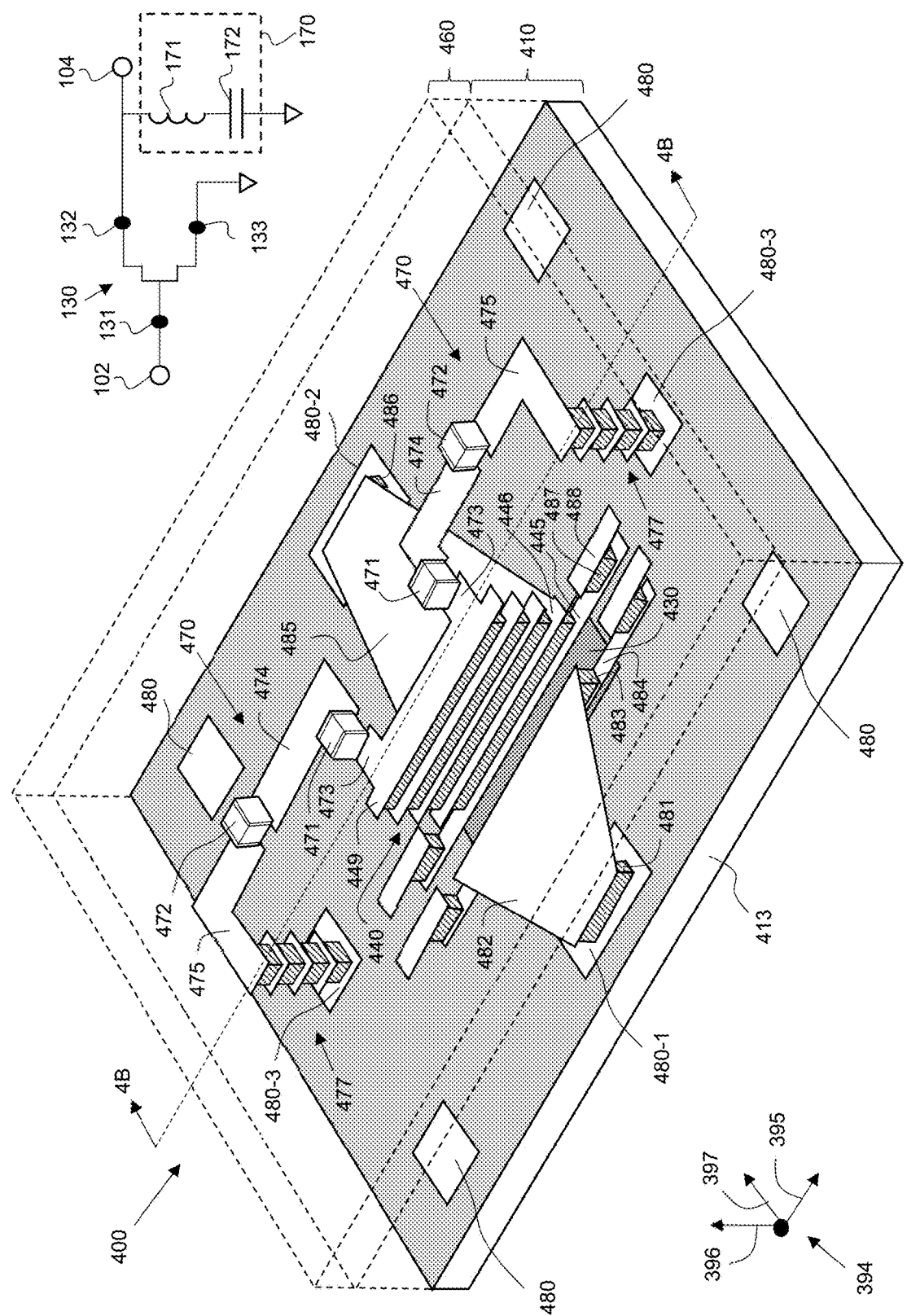
FIG. 4A is a perspective, cut-away view of a power amplifier device, according to an example embodiment.
Figure 4B:
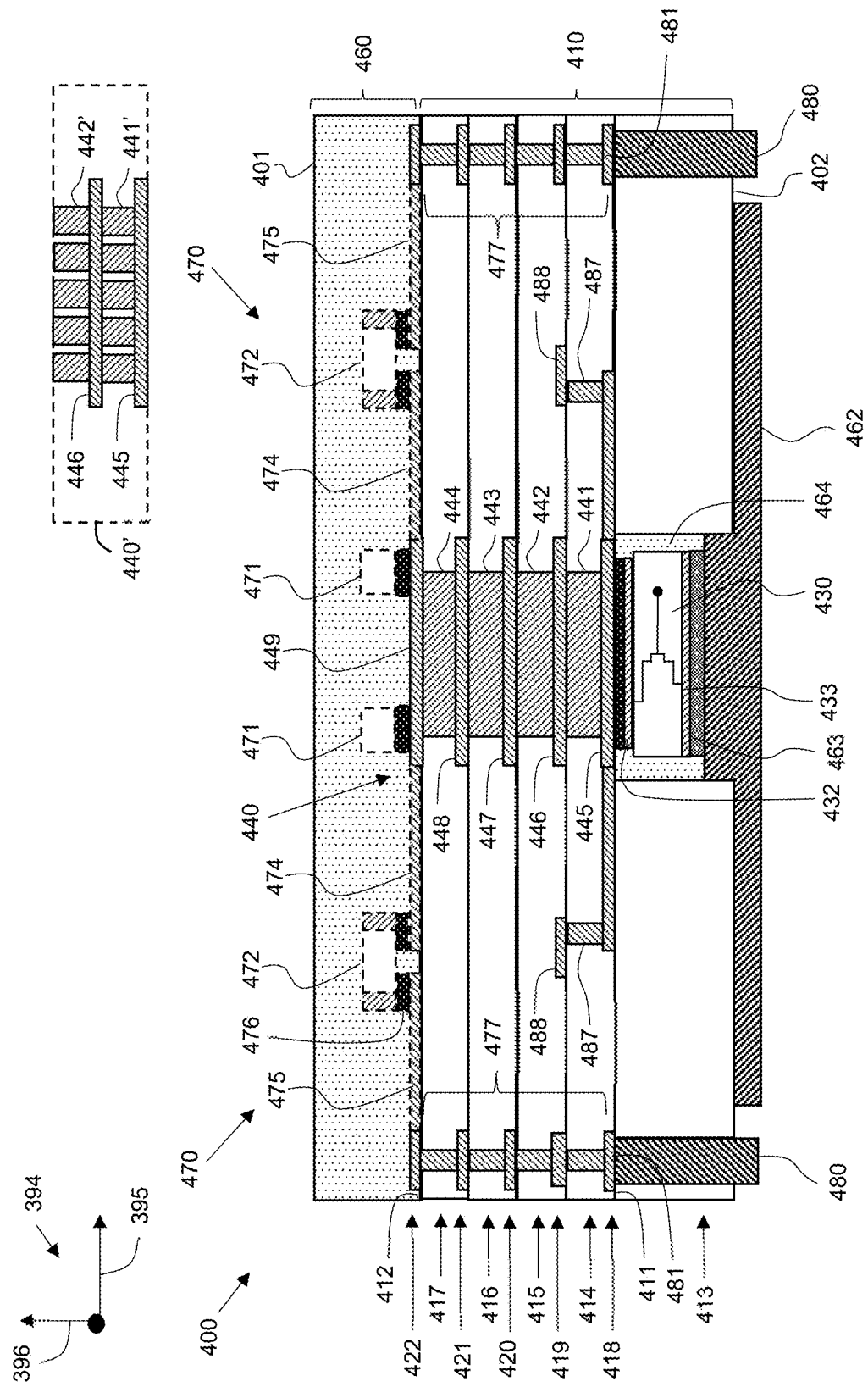
FIG. 4B is a side, cross-sectional view of the power amplifier device of FIG. 4A along bisection line 4B, according to an example embodiment.
Figure 4C:
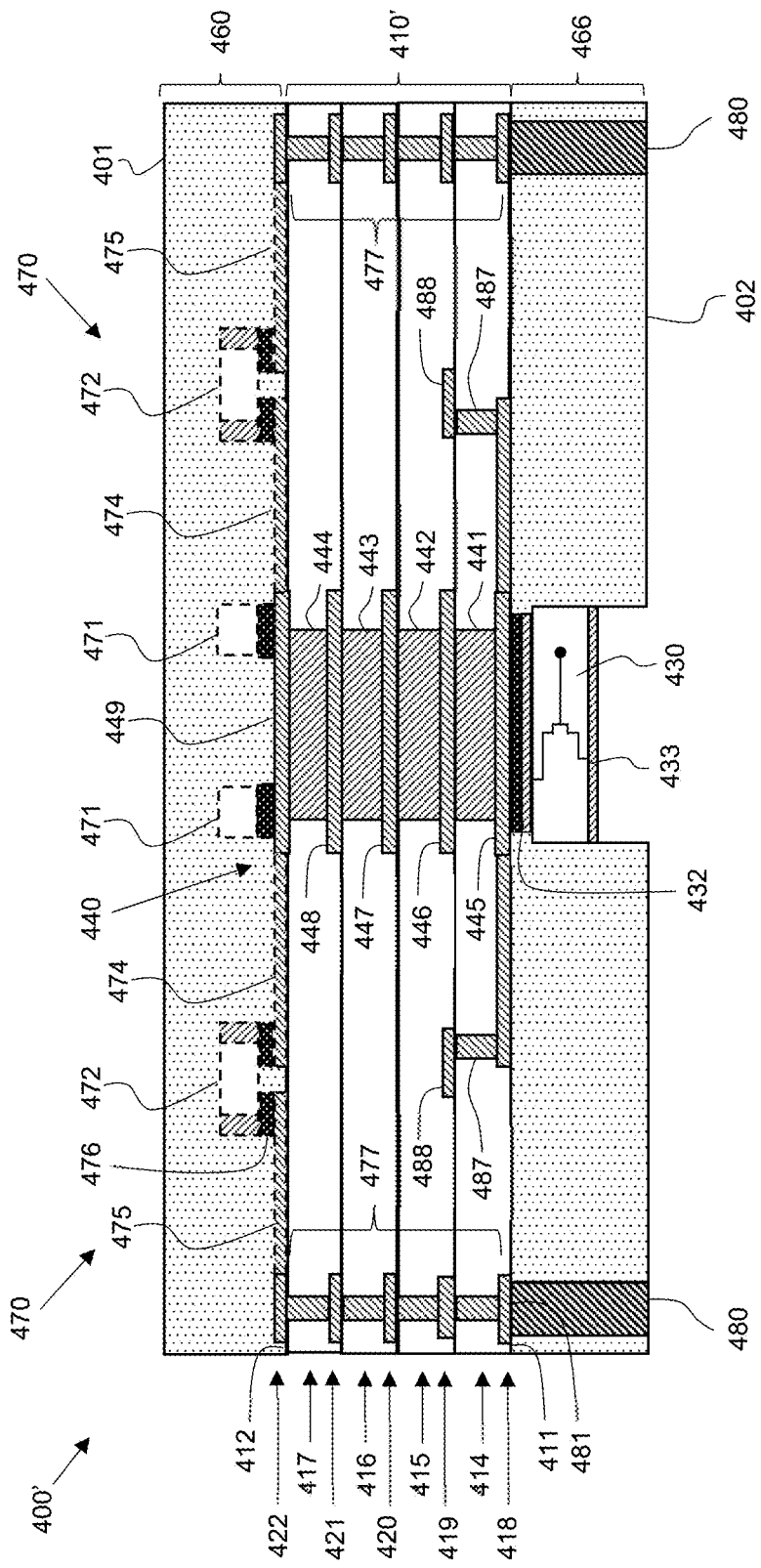
FIG. 4C is a side, cross-sectional view of the power amplifier device of FIG. 4A along bisection line 4B, according to another example embodiment.

FIG. 4A is a perspective, cut-away view of power amplifier device 400 (e.g., power amplifier device 200, FIG. 2A-B), according to an example embodiment. For enhanced understanding, FIG. 4A should be viewed in conjunction with FIG. 4B, which is a side, cross-sectional view of the power amplifier device 400 of FIG. 4A along bisection line 4B (or a cross-sectional view of power amplifier device 200 of FIGS. 2A-B along bisection line 4B). Additionally, a simplified schematic of the circuitry encapsulated within power amplifier device 400 is shown in the upper right corner of FIG. 4A. When this schematic is compared with the schematic of the amplifier 100 of FIG. 1, it may be observed that the circuitry encapsulated within power amplifier device 400 is a subset of the circuitry of amplifier 100. In FIGS. 4A-C, the same Cartesian coordinate system 394 from FIG. 3 is illustrated, to provide an understanding of the orientations of the various elements of device 400, including an understanding of the orientation of the power transistor die 430 (e.g., power transistor die 300, FIG. 3) with respect to the other elements of device 400.

As shown most clearly in FIG. 4B, power amplifier device 400 has a device body, which includes an encapsulation material layer 460 (e.g., layer 260, FIGS. 2A-B) connected to a substrate 410 (e.g., substrate 210, FIGS. 2A-B). The substrate 410 is formed from a stack of multiple dielectric layers 413, 414, 415, 416, 417 and multiple patterned conductive layers 418, 419, 420, 421, 422 in an alternating arrangement. Although FIGS. 4A-B depict four dielectric layers 413-417 and five patterned conductive layers 418-422, the substrate 410 may have more or fewer dielectric layers and/or patterned conductive layers. In the embodiment of power amplifier device 400 shown in FIG. 4B, layer 413 is a lower-most dielectric layer.

Reference is briefly made to an alternate embodiment depicted in FIG. 4C, which is a side, cross-sectional view of an alternate embodiment of a power amplifier device 400', in which the lower-most dielectric layer 413 (FIGS. 4A-B) is replaced with a second encapsulation material layer 466. In other words, in device 400', substrate 410' does not include layer 413 (FIGS. 4A-B), but instead includes a second encapsulation material layer 466, which covers substrate surface 411 and the sidewalls of die 430. Other than this detail, the device 400' of FIG. 4C is substantially identical to the device 400 of FIGS. 4A-B, and the details and various embodiments discussed herein in conjunction with FIGS. 4A-B apply equally to the device 400' of FIG. 4C. In particular, elements labeled with the same reference number in FIGS. 4A-B and 4C are substantially identical, and all of the details and alternate embodiments described herein for such elements applies to all of the figures in which the reference numbers appear.

Referring again to FIGS. 4A-B, a plurality of conductive vias (e.g., via 487) electrically connect the patterned conductive layers 418-422. In the view of FIG. 4A, the encapsulation material layer 460 and dielectric layers 414-417 have been removed to more easily depict various structures associated with embodiments of the inventive subject matter. Of the dielectric layers 413-417, only dielectric layer 413 is depicted in FIG. 4A, along with other inventive features.

In both FIGS. 4A and 4B, first and second elongated substrate die contacts 445, 484 (e.g., drain and gate contacts, respectively) are exposed at an interior first substrate surface 411. Essentially, the elongated substrate die contact 445, 484 are conductive features of the substrate 410 that are suitable for attachment (e.g., solder or sinter attachment) to bondpads of a power transistor die 430 (e.g., to bondpads 342, 340, FIG. 3, respectively).

The power transistor die 430, which may have a configuration similar or identical to power transistor die 300 (FIG. 3), is coupled to the interior first substrate surface 411. The first substrate surface 411 is recessed below the lower device surface 402, in an embodiment, and the die 430 may be inserted into an opening in the lower dielectric layer 413 that exposes the first substrate surface 411. Dielectric filler material 464 (e.g., plastic encapsulant) may fill the gap between the die 430 and sidewalls of the opening. A thermal structure 462 that extends into the die opening thermally couples to the embedded die 430 and extends outwardly to define a portion of the lower device surface 402. The thermal structure 462 provides a means for removing heat produced by the die 430, and also functions as a ground reference node for the source terminal of the transistor within die 430.

According to an embodiment, the power transistor die 430 includes at least one integrated transistor (e.g., transistor 130 or 380, FIGS. 1, 3, such as a Si, GaN, SiGe, HEMT, LDMOS, or other transistor), which functions as the primary amplifying element of a power amplifier (e.g., amplifier 100, FIG. 1). As discussed previously in conjunction with FIG. 3, the gate terminal (e.g., gate terminal 131, 381, FIGS. 1, 3) of the integrated transistor is connected to the gate bondpad, not numbered (e.g., gate bondpad 340, FIG. 3) of the die 430. As shown most clearly in FIG. 4B, the drain terminal (e.g., drain terminal 182, 382, FIGS. 1, 3) of the integrated transistor is connected to the drain bondpad 432 (e.g., drain bondpad 342, FIG. 3) of the die 430. Additionally, the source terminal (e.g., source terminal 183, 383, FIGS. 1, 3) of the integrated transistor is connected to a conductive bottom layer 433 at the lower surface of the die 430.

In order to connect the die 430 to the substrate 410, the elongated gate bondpad (e.g., bondpad 340, FIG. 3) of power transistor die 430 is connected to the elongated substrate die contact 484, and the elongated drain bondpad 432 (e.g., drain bondpad 342, FIG. 3) of power transistor die 430 is connected to the elongated substrate die contact 445. Thus, the die 430 is connected to the first substrate surface 411.

The gate and drain bondpads may be coupled to the substrate die contacts 484, 445 using solder, sinter, conductive epoxy, or other conductive connections. As described in detail in conjunction with FIG. 3, the gate and drain bondpads of die 430 are elongated bondpads, according to an embodiment, meaning that their lengths are significantly greater than their widths, and/or that their lengths are at least 50 percent the width of die 430.

According to a further embodiment, each of the die contacts 484, 445, which are exposed at surface 411 of the substrate 410, are shaped and sized to correspond to the shape and size of the gate or drain bondpad to which the substrate die contact 484, 445 is connected. In other words, the substrate die contacts 484, 445 also are elongated, and in the plane defined by axes 395 and 397 of coordinate system 394, further may have two-dimensional shapes and sizes that are substantially similar or identical to the two-dimensional shapes and sizes of the bondpads (e.g., bondpads 340, 342, 432) to which they are connected, in order to ensure good connection along the entire lengths of the gate and/or drain bondpads, or at least along a substantial portion (e.g., 50-90 percent) of the gate and/or drain bondpads. This is shown most clearly in FIG. 4B, where drain bondpad 432 of die 430 is connected across its entire bondpad length to die contact 445 (e.g., using solder, sinter, conductive epoxy, etc.). During operation of device 400, this enables equal power distribution across the connections between the elongated bondpads of die 430 and the elongated substrate die contacts 484, 445.

Additional aspects of the device 400 will now be discussed. Referring to FIG. 4B, for example, the above-mentioned thermal structure 462 extends into the opening of the outermost substrate layer(s) 413, and is coupled (e.g., using die attach 463, solder, or other suitable conductive materials) to the conductive bottom layer 433 of the power transistor die 430, in an embodiment. The outer surface of the thermal structure 462 corresponds to a portion of the lower surface 402 of the device 400. As will be explained in more detail later, the thermal structure 462 is configured to convey heat generated by the die 430 away from the die 430, and to an external system heat sink (e.g., heat extraction component 1230, 1330, FIGS. 12, 13) associated with an amplifier system (e.g., a transmitter of a communication system).

As mentioned initially when describing FIG. 2B, a plurality of conductive interconnects 480 (e.g., interconnects 280, FIG. 2B), including interconnects 480-1, 480-2, and 480-3, have distal ends exposed at the lower device surface 402. Accordingly, the lower device surface 402 may be considered a contact surface of the device 400. The conductive interconnects 480 extend through the outermost substrate layer(s) 413, and their proximal ends are electrically connected to the patterned conductive layers 418-422 of the substrate 410. These connections may be made through interconnect contacts (e.g., contacts 481, FIG. 4B). For example, the interconnect contacts 481 may be positioned at the first substrate surface 411. As mentioned previously, the conductive interconnects 480 (e.g., interconnects 280, FIG. 2B) are configured to convey RF signals, bias voltages, control signals, and ground connections to the amplifier circuitry (e.g., die 430 and surface mount components 471, 472) embedded within the device 400.

In FIG. 4A, conductive interconnect 480-1 more specifically corresponds to an RF input terminal (e.g., terminal 102, FIG. 1), and thus is referred to as RF input interconnect 480-1. RF input interconnect 480-1 is coupled through the substrate 410 to the die contact 484 (and thus to the gate bondpad of die 430). For example, the RF input interconnect 480-1 may be coupled to die contact 484 through a first via 481 that extends from interconnect 480-1 through dielectric layer 414 to the proximal end of a conductive input element 482, through the conductive input element 482, and through a second via 483 that extends from the distal end of conductive input element 482 through dielectric layer 414 to the substrate die contact 484. As shown in FIG. 4A, the conductive input element 482 may be tapered to transition from a first width at its proximal end to a second and larger width at its distal end, and the second via 482 may be an elongated via with a length approximately equal to the width of the conductive input element 482 at its distal end. For example, the distal-end width of the conductive input element 482, and the width of the second via 482, may be approximately equal to the width of the elongated substrate die contact 484. In an alternate embodiment, the elongated second via 482 may be replaced with a row of multiple narrower vias. Either way, during operation of device 400, this enables equal power distribution across the substrate die contact 484 and the gate bondpad of die 430 (e.g., gate bondpad 340, FIG. 3). In other words, the elongated configuration of the distal end of conductive input element 482, via 483, and die contact 484 provides a uniform RF power feed to the gate bondpad of die 430.

With continued reference to FIG. 4A, in some embodiments, additional conductive traces (not numbered), formed from portions of conductive layer 418, may extend beyond one or both ends of the gate-side die contact 484 to enable additional conductive vias (not numbered) within substrate 410 to be directly connected to the die contact 484 (and thus closely coupled to the gate bondpad 340 of die 430). Through additional patterned portions of the overlying conductive layers (not numbered) and additional conductive vias, these additional conductive vias may be electrically connected to interconnects 480 and/or various other circuits integrated within the device 400 (e.g., bias circuits, harmonic frequency termination circuits, control circuits, and so on).

On the output side of device 400, the drain bondpad 432 (FIG. 4B) is connected to the drain-side die contact 445, as discussed above. Similar to the input side, in some embodiments, additional conductive traces (not numbered), formed from portions of conductive layer 418, may extend beyond one or both ends of the drain-side die contact 445 to enable additional conductive vias 487 within substrate 410 to be directly connected to the die contact 445 (and thus closely coupled to the drain bondpad 432 of die 430). Through additional patterned portions 488 of the overlying conductive layers and additional conductive vias, these additional conductive vias 487 may be electrically connected to interconnects 480 and/or various other circuits integrated within the device 400 (e.g., bias circuits, harmonic frequency termination circuits, control circuits, and so on).

Further, in an embodiment, the drain-side die contact 445 is coupled to a vertical interconnect structure 440, which extends through substrate 410 in a direction perpendicular to substrate surface 411 (i.e., in a direction parallel to axis 396 of coordinate system 394). Essentially, the vertical interconnect structure 440 provides an electrical connection between the drain-side die contact 445 (and thus the drain bondpad 432) and an upper surface 412 of the substrate 410.

According to an embodiment, the vertical interconnect structure 440 includes a stack of multiple elongated vias 441, 442, 443, 444, which extend through dielectric layers 414-417, and multiple elongated conductive layer portions 445, 446, 447, 448, 449 formed from portions of the multiple patterned conductive layers 418-422. As shown in FIGS. 4A-B, the elongated conductive layer portions 445-449 are interleaved with the multiple elongated vias 441-444. In the embodiment illustrated in FIGS. 4A-B, the vias 441-444 are stacked directly over each other (i.e., aligned along an axis extending parallel to axis 396). In an alternate embodiment, the vias 441-444 may be offset from each other (i.e., not stacked directly on top of each other) between substrate surface 411 and substrate surface 412.

Further, although FIGS. 4A-B show a vertical interconnect structure 440 with four elongated vias 441-444 and five conductive layer portions 445-449, in other embodiments (e.g., embodiments with more or fewer dielectric layers 414-417 and/or conductive layers 418-422), the vertical interconnect structure 440 may have more or fewer elongated vias 441-444 and/or conductive layer portions 445-449. Further still, in some embodiments, some or all of the elongated vias 441-444 may be replaced with a row of vias (e.g., vias 441', 442'), as shown in box 440' in the upper right corner of FIG. 4A. As used herein, the term "elongated via" may mean either a single via (e.g., via 441) with a via length (i.e., a dimension parallel to axis 395) that is at least five times greater than a via width (i.e., a dimension parallel to axis 397), or a set of multiple (e.g., two or more) vias (e.g., vias 441' or 442') with a combined total via length (including spaces between the vias) that is at least five times greater than a via width.

The configuration of the vertical interconnect structure 440 provides for an elongated electrical connection of an RF output terminal (e.g., conductive interconnect 480-2) to the drain bondpad 432, which connection may be made laterally to the vertical interconnect structure 440. More specifically, conductive interconnect 480-2 corresponds to an RF output terminal (e.g., terminal 104, FIG. 1). Conductive interconnect 480-2 thus is referred to as RF output interconnect 480-2, herein. As best shown in FIG. 4A, RF output interconnect 480-2 is coupled through the substrate 410 to the vertical interconnect structure 440 (and thus to die contact 445 and the drain bondpad 432 of die 430). For example, the RF output interconnect 480-2 may be electrically coupled to one of the conductive layer portions 445-449 of the vertical interconnect structure 440.

As shown in FIG. 4A, this connection is made with a conductive output element 485, which has a proximal end coupled to (connected to) conductive layer portion 446 (or to another one of the conductive layer portions 445, 447, 448, 449), and a distal end coupled to a via 486 that extends from the distal end of conductive output element 485 through dielectric layer 414 to RF output interconnect 480-2. The conductive output element 485 may, for example, be formed from a same conductive layer (e.g., conductive layer 419) as the conductive layer portion (e.g., conductive layer portion 446) to which it is connected, and thus the conductive layer portion 446 and the conductive output element 485 may be integrally connected (e.g., forming portions of a same conductive structure).

As also shown in FIG. 4A, the conductive output element 485 may be tapered to transition from a first width at its proximal end to a second width at its distal end. For example, the first width of the conductive output element 485 may be approximately equal to the width of the elongated substrate die contact 445 and/or the elongated via 441. Accordingly, during operation of device 400, this enables equal power distribution across drain bondpad 432 of die, the substrate die contact 445, elongated via 441, and conductive layer portion 446. In other words, the elongated configuration of the proximal end of conductive output element 485, conductive layer portion 446, via 441, and die contact 445 provides a uniform RF power termination to the drain bondpad 432 of die 430. In addition, as can be seen in FIG. 4A, the conductive output element 485 extends along an axis that is parallel to axis 397 of coordinate system 394, which also is perpendicular to (orthogonal to) the direction that the vertical interconnect structure 440 extends (i.e., a direction parallel to axis 396 of coordinate system 394).

According to an embodiment, one or more additional circuits 470 are electrically coupled to the vertical interconnect structure 440. These additional circuits 470 have components that are physically coupled to the upper substrate surface 412 and electrically coupled to the vertical interconnect structure 440. The circuits 470 each may include at least one passive component (e.g., at least one inductor, capacitor, and/or resistor), which may be embodied as one or more surface mount components, integrated passive devices, or flip-chip components. As shown in FIGS. 4A-B, identical first and second circuits 470 have proximal ends that are directly connected to opposite ends of conductive layer portion 449, which essentially is a conductive trace exposed at the upper surface 412 of substrate 410. In other embodiments, the proximal ends of circuits 470 may be directly connected to a different one of the conductive layer portions 445-448 (e.g., using additional vias through one or more of the dielectric layers 414-417). Distal ends of the circuits 470 are electrically coupled to interconnects 480-3 through conductive stacks 477 of vias/conductive pads that extend through the substrate 410.

According to an embodiment, each circuit 470 is a shunt circuit (e.g., shunt circuit 170, FIG. 1) electrically coupled between the vertical interconnect structure 440 (and thus the drain terminal 432 of the power transistor 430) and an interconnect 480-3 (e.g., one of interconnects 280, FIG. 2B). When incorporated into a larger system, interconnects 480-3, in turn, may be coupled to a ground reference, thus establishing circuits 470 as shunt circuits. According to an embodiment, each shunt circuit 470 is a series LC circuit formed from a discrete, surface mount inductor 471 (e.g., inductance 171, FIG. 1) coupled in series with a discrete, surface mount capacitor 472 (e.g., capacitor 172, FIG. 1). To provide the electrical connections between the vertical interconnect structure 440, inductor 471, capacitor 472, and interconnect 480-3, various conductive traces 473, 474, 475 may be formed at the upper surface 412 of the substrate 410 (e.g., from portions of conductive layer 422). In the embodiment of FIGS. 4A-B, a first conductive trace 473 at upper surface 412 extends perpendicularly from the vertical interconnect structure 440 (e.g., trace 473 extends from conductive layer portion 449 in a direction parallel to axis 397), and a first terminal of inductor 471 is connected to the first conductive trace 473. A second conductive trace 474 at upper surface 412 extends between a second terminal of inductor 471 and a first terminal of capacitor 472. A third conductive trace 475 at upper surface 412 extends between a second terminal of capacitor 472 and a conductive stack 477. The inductor 471 and the capacitor 472 may be coupled to the traces 473, 474, 475 (and to the upper surface 412) using, for example, solder 476, sinter material, conductive epoxy, or other conductive attachment means.

Circuit(s) 470 may have any of a number of functions. For example, each circuit 470 may be configured to function as a harmonic frequency termination circuit, which provides a low impedance path to ground for signal energy at the second harmonic frequency, 2f0, of the fundamental frequency of operation of the device 400 (i.e., each circuit 470 may be an LC circuit in which the combination of the inductor 471 and the capacitor 472 resonate at or near the second harmonic frequency). In other embodiments, each circuit 470 may have another function. For example each circuit 470 may form a portion of an output impedance matching network. Alternatively, each circuit 470 may be configured to function as a "shunt-L" circuit that may improve the output impedances at the RF output terminal 480-2 of the device 400. In a shunt-L circuit, the inductor 471 functions to resonate out the drain terminal-source terminal capacitance, Cds, of the power transistor within power transistor die 430, and the capacitor 472 is a DC blocking capacitor. In various embodiments, additional circuitry (e.g., baseband decoupling circuitry), not illustrated, may be coupled to the conductive trace 474 between inductor 471 and capacitor 472. In still other embodiments, each circuit 470 may include additional or different discrete passive and/or active components and/or may have different functionalities.

An encapsulation material layer 460 (e.g., layer 260, FIGS. 2A-B) covers the surface mount components 471, 472 and the second substrate surface 412. The encapsulation material layer 460 essentially defines the upper device surface 401. According to an embodiment, sidewalls of the substrate 410 and sidewalls of the encapsulation material layer 460 are co-planar.

During operation, an input RF signal is received at RF input connector 480-1, and the RF signal is conveyed through vias 481, 483, conductive input element 482, and die contact 484 to the gate bondpad (e.g., gate bondpad 340, FIG. 3) of the power transistor die 430. The power transistor within die 430 amplifies the received signal to produce an amplified RF signal at its drain bondpad 432. The amplifier RF signal is then conveyed from the drain bondpad 432 through the substrate die contact 445 and the vertical interconnect structure 440 to the conductive output element 485. The conductive output element 485, in turn, conveys the amplified RF signal to the RF output interconnect 480-2. In addition, circuits 470 coupled to the vertical interconnect structure 440 provide additional electrical functionality (e.g., harmonic termination, shunt-L, and so on). Gate and/or drain bias voltages may be received through additional vias (e.g., vias 487) and additional patterned portions (e.g., portion 488) of the conductive layers 419-421, in an embodiment, or through additional connections to the vertical interconnect structure 440, in other embodiments.

FIGS. 4A-C illustrate embodiments of power amplifier devices 400, 400' that include LC circuits 470 formed from discrete, surface mount components 471, 472 as the inductor and capacitor, respectively. In other embodiments, other types of circuit components alternatively may be used.

Figure 5:
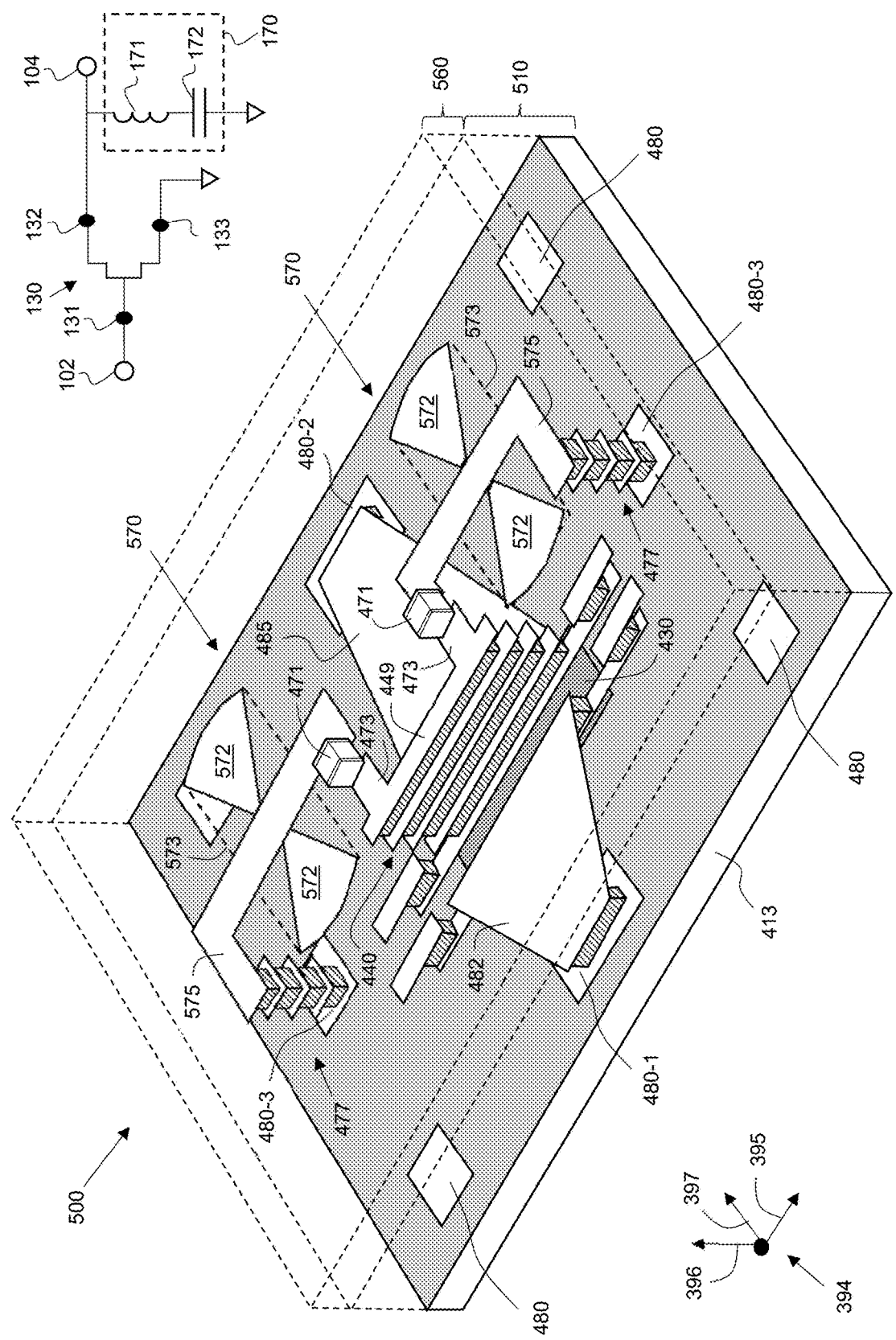
FIG. 5 is a perspective, cut-away view of a power amplifier device, according to another example embodiment.

For example, reference is now made to FIG. 5, which is a perspective, cut-away view of a power amplifier device 500, according to another example embodiment. Comparing power amplifier devices 400 (FIGS. 4A-B) and 500 (FIG. 5), it can be seen that, in power amplifier device 500, the output-side LC circuits 570 each are formed from a series combination of inductor 471 and a capacitance in the form of radial stubs 572. In some embodiments, the radial stubs 572 may replace capacitor 472 in device 400 (FIGS. 4A-B). Each stub 572 may be made capacitive or inductive according to whether the conductive path to which it is coupled presents an inductive or capacitive impedance, respectively.

Either way, each radial stub 572 includes a planar, radial conductive element, which overlies a ground plane 573. The narrow point of each radial stub 572 is electrically coupled to a conductive trace 574 (e.g., a continuous combination of lines 474 and 475, FIG. 4A), which provides a conductive path between a terminal of inductor 471 and conductive stack 477. An encapsulation material layer 560 (e.g., layer 260, FIGS. 2A-B) covers the surface mount inductors 471, the radial stubs 572, and the upper surface of substrate 510.

Further, in the embodiment illustrated in FIG. 5, the radial conductive element of each stub 572 is formed from radial-shaped (i.e., shaped like a planar sector of a circle) patterned portions of an uppermost conductive layer (e.g., layer 422, FIG. 4B), and the ground plane 573 is formed from a portion of an underlying conductive layer (e.g., layer 421, FIG. 4B). In other embodiments, the radial conductive element may be formed from portions of another conductive layer (e.g., any of layers 418-421, FIG. 4B), and the ground plane 573 could be formed from a portion of another conductive layer.

In the embodiment of FIG. 5, in each shunt circuit 570, two radial stubs 572 are coupled to opposite sides of conductive trace 575. Such a configuration of radial stubs 572 may be referred to as a "butterfly" or "bowtie" stub. In other embodiments, each shunt circuit 570 may include only a single radial stub 572 coupled to one side of the conductive trace 575, or each shunt circuit 570 may include more than two radial stubs 572 coupled to the conductive trace 575 (e.g., at different points along trace 575).

Other than the inclusion of radial stub 572 as the capacitance in shunt circuit 570, the device 500 of FIG. 5 is substantially identical to the device 400 of FIGS. 4A-B, and the details and various embodiments discussed herein in conjunction with FIGS. 4A-B apply equally to the device 500 of FIG. 5. In particular, elements labeled with the same reference number in FIGS. 4A-B and 5 are substantially identical, and all of the details and alternate embodiments described herein for such elements applies to all of the figures in which the reference numbers appear.

Additional modifications to the devices of FIGS. 4A-C and 5 also could be made. For example, reference is now made to FIG. 6, which is a perspective, cut-away view of a power amplifier device 600, according to yet another example embodiment. The embodiment of device 600 in FIG. 6 differs from the previously-described embodiments in that device 600 includes components associated with an output impedance matching network (OMN) (e.g., OMN 160, FIG. 1, as shown in the upper right corner of FIG. 6) coupled between the output/drain bondpad (e.g., bondpad 342, FIG. 3) of power transistor die 430 and conductive interconnect 480-2.

Figure 6:
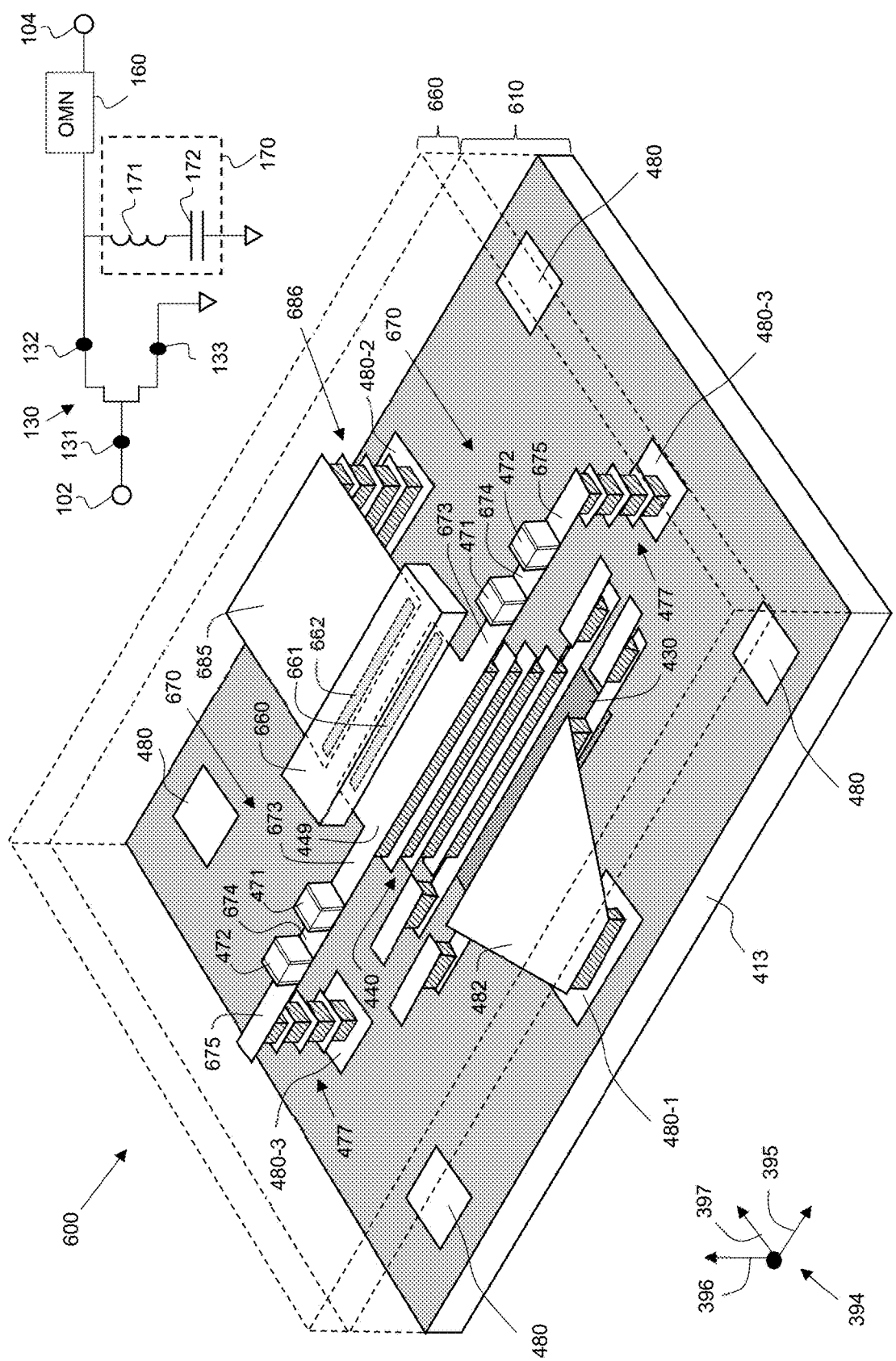
FIG. 6 is a perspective, cut-away view of a power amplifier device, according to yet another example embodiment.

According to an embodiment, components of the output impedance matching network (e.g., capacitors, inductances, and/or resistors) may be integrated within an integrated passive device 660 (IPD), which is coupled to the top surface of substrate 610. The IPD 660 includes input and output terminals 661, 662, which are electrically coupled, respectively, to the output/drain bondpad (e.g., bondpad 342, FIG. 3) of power transistor die 430, and to the conductive interconnect 480-2 (e.g., RF output terminal 104). For example, the input terminal 661 of IPD 660 may be coupled to the vertical interconnect structure 440 (e.g., to the upper conductive layer portion 449 of structure 440). As can be seen in FIG. 6, the upper conductive layer portion 449 of vertical interconnect structure 440 extends orthogonally from structure 440 (e.g., parallel to axis 397) to the input terminal 661 of IPD 660. Further, the output terminal 662 of IPD 660 may be coupled to the proximal end of conductive output element 685, and the distal end of conductive output element 685 is coupled to the RF output interconnect 480-2 through a conductive stack 686 of vias/conductive pads that extend through the substrate 610. According to an embodiment, the conductive output element 685 is formed from a portion of the upper conductive layer (e.g., layer 422, FIG. 4B). The terminals 661, 662 of IPD 660 may be coupled to the conductive layer portion 449 and the conductive output element 685, respectively, using, for example, solder, sinter material, conductive epoxy, or other conductive attachment means.

IPD 660 may include a base semiconductor substrate and a plurality of integrated passive components (e.g., inductors, capacitors, and resistors), which are electrically coupled between the input and output terminals 661, 662. As a non-limiting example, and referring briefly to FIG. 1, the components of a T-match network such as that shown above block 160 may be integrally formed within IPD 660. In such an embodiment, a ground connection may be necessary for shunt portion(s) of the output impedance matching network, and IPD 660 may include an additional terminal (not shown) that is coupled through the substrate 610 to a ground refence node (e.g., to conductive interconnect 480-3).

Similar to power amplifier devices 400 (FIGS. 4A-B) and 500 (FIG. 5), power amplifier device 600 includes output-side LC circuits 670, each being formed from a series combination of a surface-mount inductor 471 and a surface-mount capacitor 472 (or a radial stub 572, FIG. 5). Circuits 670 differ slightly from circuits 470 (FIGS. 4A-C), however. In particular, circuits 470 (FIGS. 4A-C) extend orthogonally in a first direction (i.e., a direction parallel to axis 397) from the vertical interconnect structure 440, whereas circuits 670 extend orthogonally in second directions (i.e., directions parallel to axis 395) from the vertical interconnect structure 440. Said another way, the proximal ends of circuits 670 may include first conductive traces 673 that essentially are conductive extensions from both ends of conductive layer portion 449 of vertical interconnect structure 440. Accordingly, whereas the forward amplification path (e.g., including IPD 660 and conductive output element 685) extends in a first orthogonal direction from structure 440, circuits 670 extend in a second orthogonal direction from structure 440. The first and second orthogonal directions also are orthogonal to each other, in an embodiment. In addition to the first conductive traces 673, each circuit 670 also includes a series combination of inductor 471, conductive trace 674, capacitor 472, and conductive trace 675. Conductive trace 675 extends between capacitor 472 and conductive stack 477. In an alternate embodiment, capacitors 472 may be replace with radial stubs (e.g., radial stubs 572, FIG. 5).

As with the other described embodiments, an encapsulation material layer 660 (e.g., layer 260, FIGS. 2A-B) covers the IPD 660, the surface mount inductors and capacitors 471, 472, and the upper surface of substrate 610. Other than the inclusion of output-side IPD 660 and the direction in which circuits 670 extend from vertical interconnect structure 440, the device 600 of FIG. 6 is substantially identical to the device 400 of FIGS. 4A-B, and the details and various embodiments discussed herein in conjunction with FIGS. 4A-B apply equally to the device 600 of FIG. 6. In particular, elements labeled with the same reference number in FIGS. 4A-B and 6 are substantially identical, and all of the details and alternate embodiments described herein for such elements applies to all of the figures in which the reference numbers appear.

The embodiments discussed in conjunction with FIGS. 4A-C, 5, and 6 each include a vertical interconnect structure 440 and shunt LC circuits 470, 570, 670 coupled to the output/drain terminal (e.g., terminal 342, FIG. 3) of a power transistor die 430. In other embodiments, a vertical interconnect structure and shunt LC circuits also or alternatively may be coupled to the input/gate terminal (e.g., terminal 340, FIG. 3) of a power transistor die 430.

Figure 7:
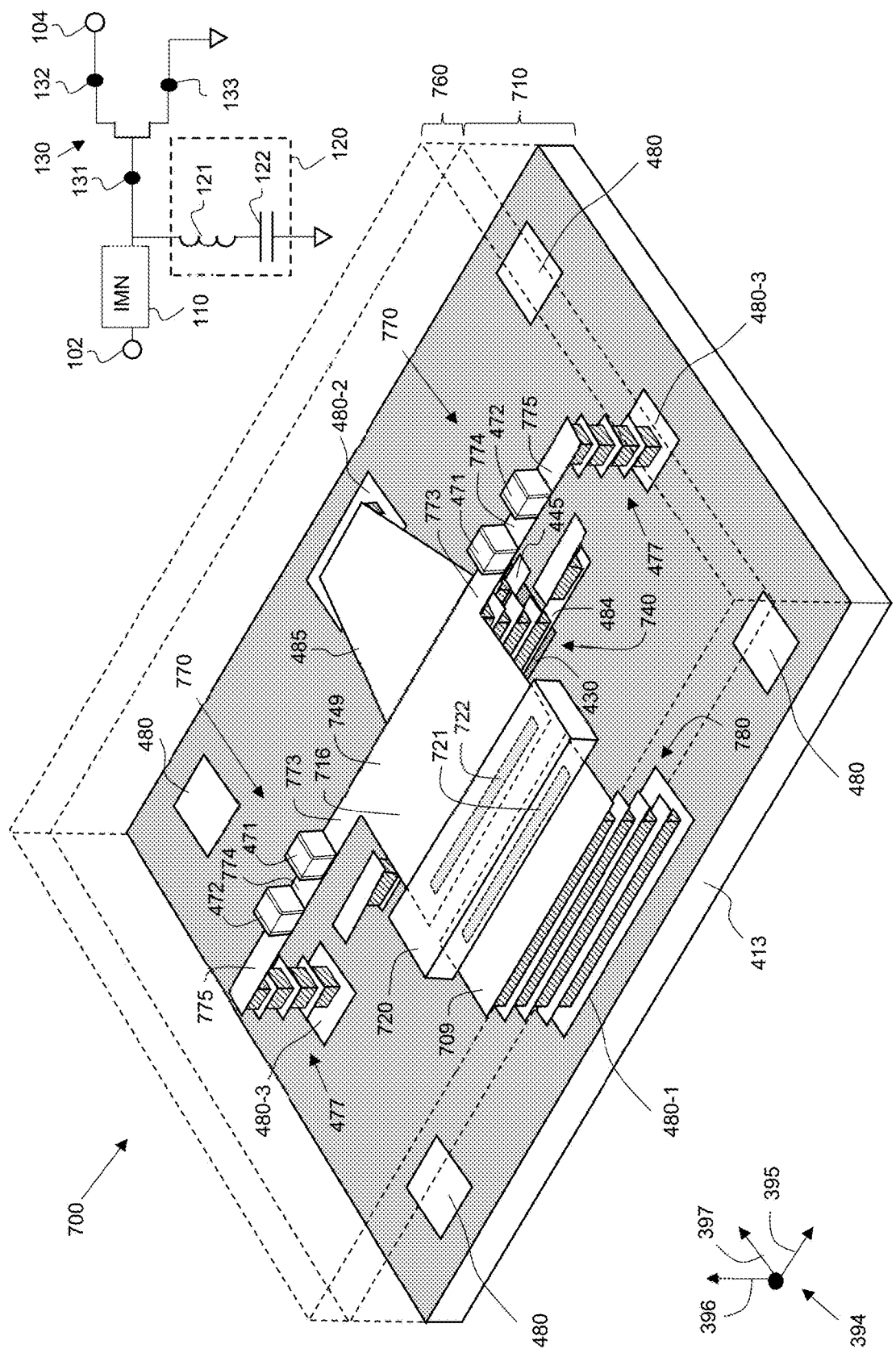
FIG. 7 is a perspective, cut-away view of a power amplifier device, according to yet another example embodiment.

For example, FIG. 7 is a perspective, cut-away view of a power amplifier device 700, according to yet another example embodiment, in which a vertical interconnect structure 740 and shunt LC circuits 770 are coupled to the input/gate terminal (e.g., terminal 340, FIG. 3) of a power transistor die 430. A simplified schematic of the circuitry encapsulated within power amplifier device 700 is shown in the upper right corner of FIG. 7.

The device 700 of FIG. 7 has several features that are substantially similar to the device 400 of FIGS. 4A-B, and the details and various embodiments discussed herein in conjunction with FIGS. 4A-B apply equally to the device 700 of FIG. 7. For example, as with device 400, power amplifier device 700 includes a substrate 710 formed from alternating patterned conductive layers (e.g., layers 418-422, FIG. 4B) and dielectric layers (e.g., layers 414-417, FIG. 4B). In addition, device 700 includes a power transistor die 430 with elongated input/gate and output/drain bondpads (e.g., bondpads 340, 342, FIG. 3), which are connected at a surface of the substrate (e.g., surface 411, FIG. 4B) to elongated substrate die contacts 484, 445, respectively. Conductive interconnects 480 (e.g., interconnects 280, FIG. 2B) facilitate electrical connections between the patterned conductive layers within device 700 and the lower device surface (e.g., surface 402, FIG. 4B). It is noted here that elements labeled with the same reference number in FIGS. 4A-B and 7 are substantially identical, and all of the details and alternate embodiments described herein for such elements applies to all of the figures in which the reference numbers appear.

Power amplifier device 700 substantially differs from device 400 (FIG. 4A), in that device 700 includes an input-side circuit that includes a vertical interconnect structure 740 and shunt LC circuits 770. More specifically, conductive interconnect 480-1 corresponds to an RF input terminal (e.g., terminal 102, FIG. 1), and the RF input interconnect 480-1 is coupled through the substrate 710 to the die contact 484 (and thus to the gate bondpad of die 430). According to an embodiment, the RF input interconnect 480-1 may be coupled to die contact 484 through a conductive stack 780 of vias/conductive pads that extend from interconnect 480-1 to the upper surface (e.g., surface 412, FIG. 4B) of the substrate 710, along with first and second conductive input elements 709, 716 and an optional IPD 720. More specifically, a first conductive input element 709, which may be formed from a portion of a conductive layer (e.g., layer 422, FIG. 4B), has a proximal end coupled to (connected to) the upper portion of the conductive stack 780, and a distal end coupled to an input terminal 721 of IPD 720. A second conductive input element 716, which also may be formed from a portion of a conductive layer (e.g., layer 422, FIG. 4B), has a proximal end coupled to (connected to) the output terminal 722 of IPD 720, and a distal end coupled to the upper portion of a vertical interconnect structure 740.

According to an embodiment, components of an input impedance matching network (e.g., capacitors, inductances, and/or resistors) may be integrated within IPD 720, which is coupled to the top surface of substrate 710. As indicated above, the IPD 720 includes input and output terminals 721, 722, which are electrically coupled, respectively, to the conductive interconnect 480-1 (e.g., RF input terminal 102) and to the input/gate bondpad (e.g., bondpad 340, FIG. 3) of power transistor die 430 through vertical interconnect structure 740. More specifically, the output terminal 722 of IPD 720 may be coupled to the vertical interconnect structure 440 (e.g., to the upper conductive layer portion 449 of structure 440), which in turn is coupled to substrate die contact 484 and the input/gate bondpad of die 430. As can be seen in FIG. 7, the upper conductive layer portion 749 of vertical interconnect structure 740 and the conductive input element 716 extend orthogonally from structure 740 (e.g., parallel to axis 397) to the output terminal 722 of IPD 720. The terminals 721, 722 of IPD 720 may be coupled to the conductive input elements 709, 716, respectively, using, for example, solder, sinter material, conductive epoxy, or other conductive attachment means.

IPD 720 may include a base semiconductor substrate and a plurality of integrated passive components (e.g., inductors, capacitors, and resistors), which are electrically coupled between the input and output terminals 721, 722. As a non-limiting example, and referring briefly to FIG. 1, the components of a T-match network such as that shown above block 110 may be integrally formed within IPD 720. In such an embodiment, a ground connection may be necessary for shunt portion(s) of the output impedance matching network, and IPD 720 may include an additional terminal (not shown) that is coupled through the substrate 710 to a ground refence node (e.g., to conductive interconnect 480-3).

The vertical interconnect structure 740 may be substantially similar to the vertical interconnect structure 440 discussed in conjunction with FIGS. 4A-C, 5, and 6, except that vertical interconnect structure 740 is coupled to the input/gate bondpad (e.g., bondpad 340, FIG. 3) of die 430, rather than being coupled to the output/drain bondpad.

The vertical interconnect structure 740 is beneficial, in that it enables additional circuitry to be coupled to the input/gate bondpad (e.g., bondpad 340, FIG. 3). For example, power amplifier device 700 may include one or more input-side LC circuits 770, each being formed from a series combination of a surface-mount inductor 471 and a surface-mount capacitor 472 (or a radial stub 572, FIG. 5). Circuit(s) 770 may have any of a number of functions. For example, each circuit 770 may be configured to function as a harmonic frequency termination circuit, which provides a low impedance path to ground for signal energy at the second harmonic frequency, 2f0, of the fundamental frequency of operation of the device 700. In other embodiments, each circuit 770 may have another function. For example each circuit 470 may form a portion of an input impedance matching network. In various embodiments, additional circuitry (e.g., baseband decoupling circuitry), not illustrated, may be coupled to the conductive trace 774 between inductor 471 and capacitor 472. In still other embodiments, each circuit 770 may include additional or different discrete passive and/or active components and/or may have different functionalities.

Circuits 770 are similar to circuits 670 (FIG. 6), in that circuits 770 extend orthogonally in a first direction (i.e., a direction parallel to axis 395) from the vertical interconnect structure 740. Said another way, the proximal ends of circuits 770 may include first conductive traces 773 that essentially are conductive extensions from both ends of conductive layer portion 749 of vertical interconnect structure 740. Accordingly, whereas the forward amplification path (e.g., including conductive input element 716) extends in a first orthogonal direction from structure 740, circuits 770 extend in a second orthogonal direction from structure 740. The first and second orthogonal directions also are orthogonal to each other, in an embodiment. In addition to the first conductive traces 773, each circuit 770 also includes a series combination of inductor 471, conductive trace 774, capacitor 472, and conductive trace 775. Conductive trace 775 extends between capacitor 472 and conductive stack 477. In an alternate embodiment, capacitors 472 may be replace with radial stubs (e.g., radial stubs 572, FIG. 5). As with the other described embodiments, an encapsulation material layer 760 (e.g., layer 260, FIGS. 2A-B) covers the IPD 710, the surface mount inductors and capacitors 471, 472, and the upper surface of substrate 710.

As discussed above, the input circuitry for device 700 includes an IPD 720 that includes components of an input impedance matching network (e.g., circuit 110, FIG. 1). In an alternate embodiment, IPD 720 may be excluded from the device 700, and a single conductive input element may be used to electrically connect the conductive stack 780 and the RF input interconnect 480-1 to the vertical interconnect structure 740. In such an embodiment, the conductive input element may be tapered in a manner similar to conductive input element 482 (FIGS. 4A, 5, 6). In still another alternate embodiment, an input conductive element may form a portion of a lower conductive layer (e.g., one of conductive layers 419-421, FIG. 4B). In such an alternate embodiment, the input conductive element may connect with a portion of vertical interconnect structure 740 that is below the upper surface of the substrate 710, similar to the manner in which, in FIG. 4A, output conductive element 485 connects to conductive layer portion 446 of vertical interconnect structure 440. Further, in an embodiment in which the input conductive element connects with a lower portion of the vertical interconnect structure 740, shunt circuits 770 may extend orthogonally from the vertical interconnect structure 740, similar to the manner in which shunt circuits 470, 570 (FIGS. 4A, 5) extend from vertical interconnect structure 440.

On the output side of the device 700, a conductive output element 485 has a proximal end electrically coupled to the output/drain bondpad (e.g., bondpad 342, FIG. 3) of the die 430 (e.g., through one or more conductive vias), and a distal end coupled to the RF output interconnect 480-2 (e.g., through one or more vias).

Each of power amplifier devices 400, 500, 600, 700 include single-stage, single-path power amplifiers (e.g., embodying all or parts of the schematic of FIG. 1). The various unique aspects of power amplifier devices 400, 500, 600, 700 also may be applied to multiple-stage and/or multiple-path power amplifiers, as well.

Figure 8:
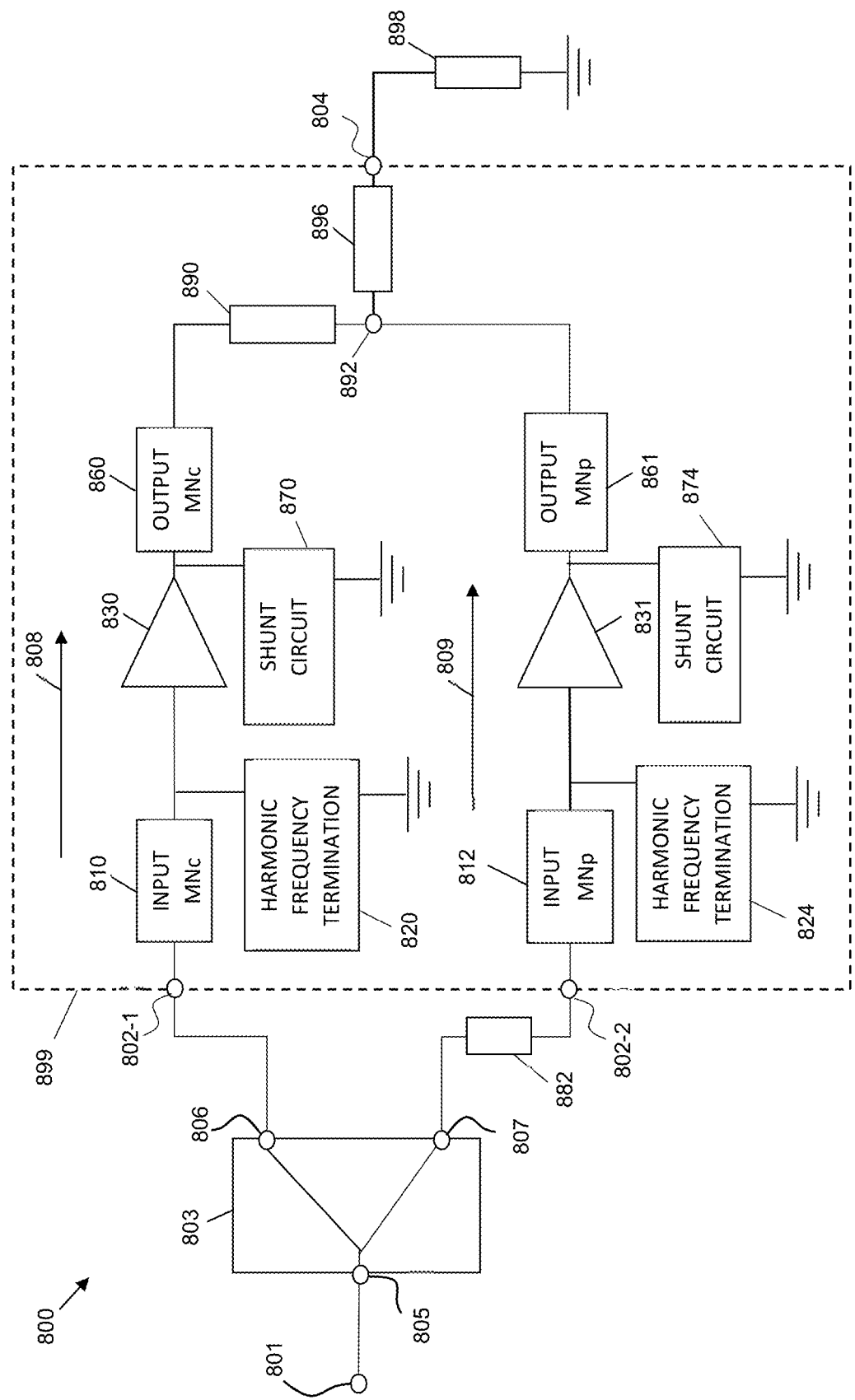
FIG. 8 is a simplified circuit diagram of a multi-path power amplifier, according to an embodiment.

For example, FIG. 8 is a simplified schematic diagram of a multiple-path power amplifier, and more specifically, a Doherty power amplifier 800, which may be implemented in an embodiment of a power amplifier device, as will be discussed in more detail later in conjunction with FIGS. 9A-C and 10. Amplifier 800 includes an input terminal 801, an output terminal 804, a power divider 803 (or splitter), a carrier amplifier path 808, a peaking amplifier path 809, and a combining node 892. The combining node 892 may be coupled to a load 898 through an output conductor 896 (e.g., a transmission line and/or impedance transformer) and output terminal 804, so that the load 898 may receive an amplified RF signal from amplifier 800.

Figure 9A:
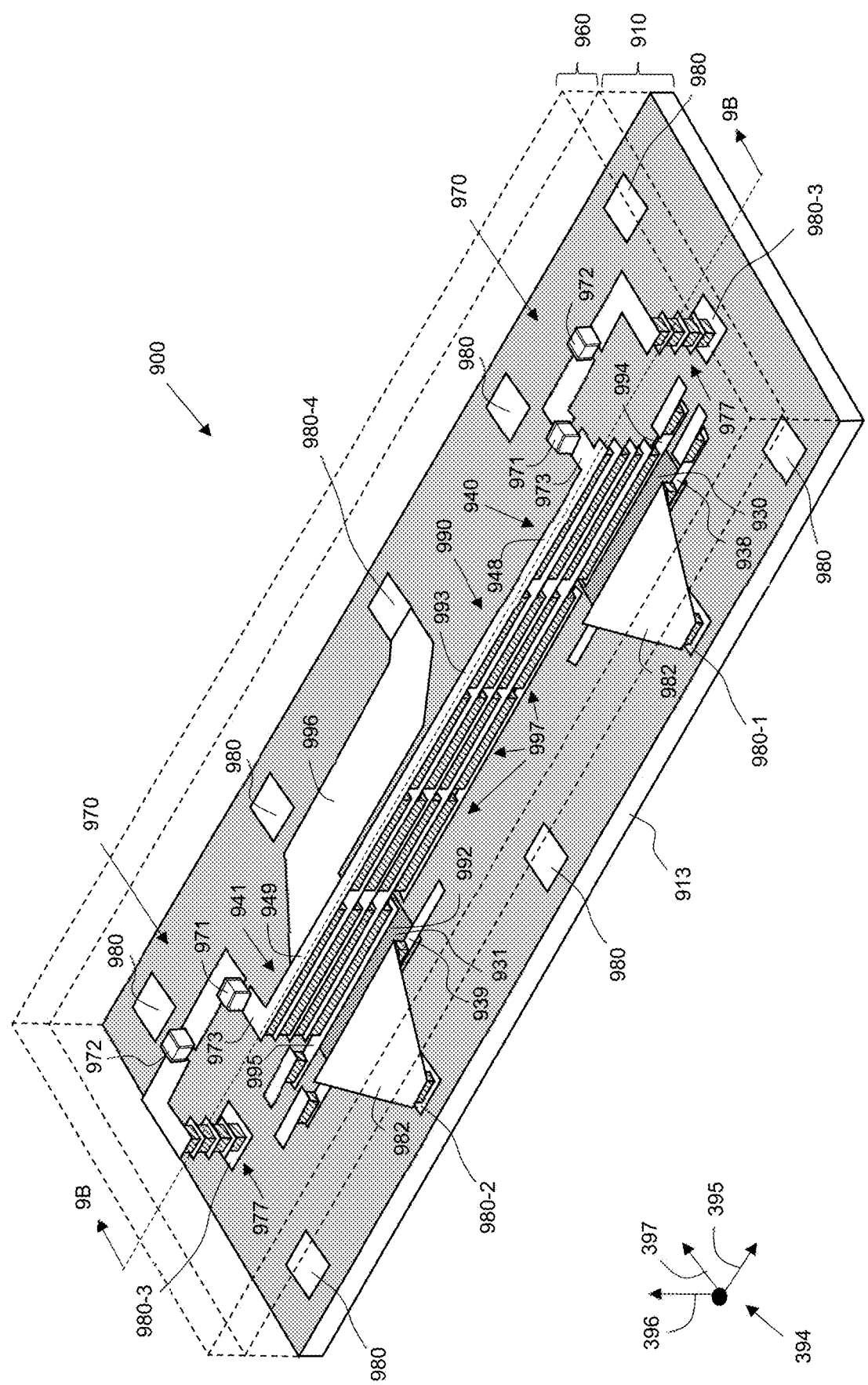
FIG. 9A is a perspective, cut-away view of a multi-path power amplifier device, according to an example embodiment.
Figure 10:
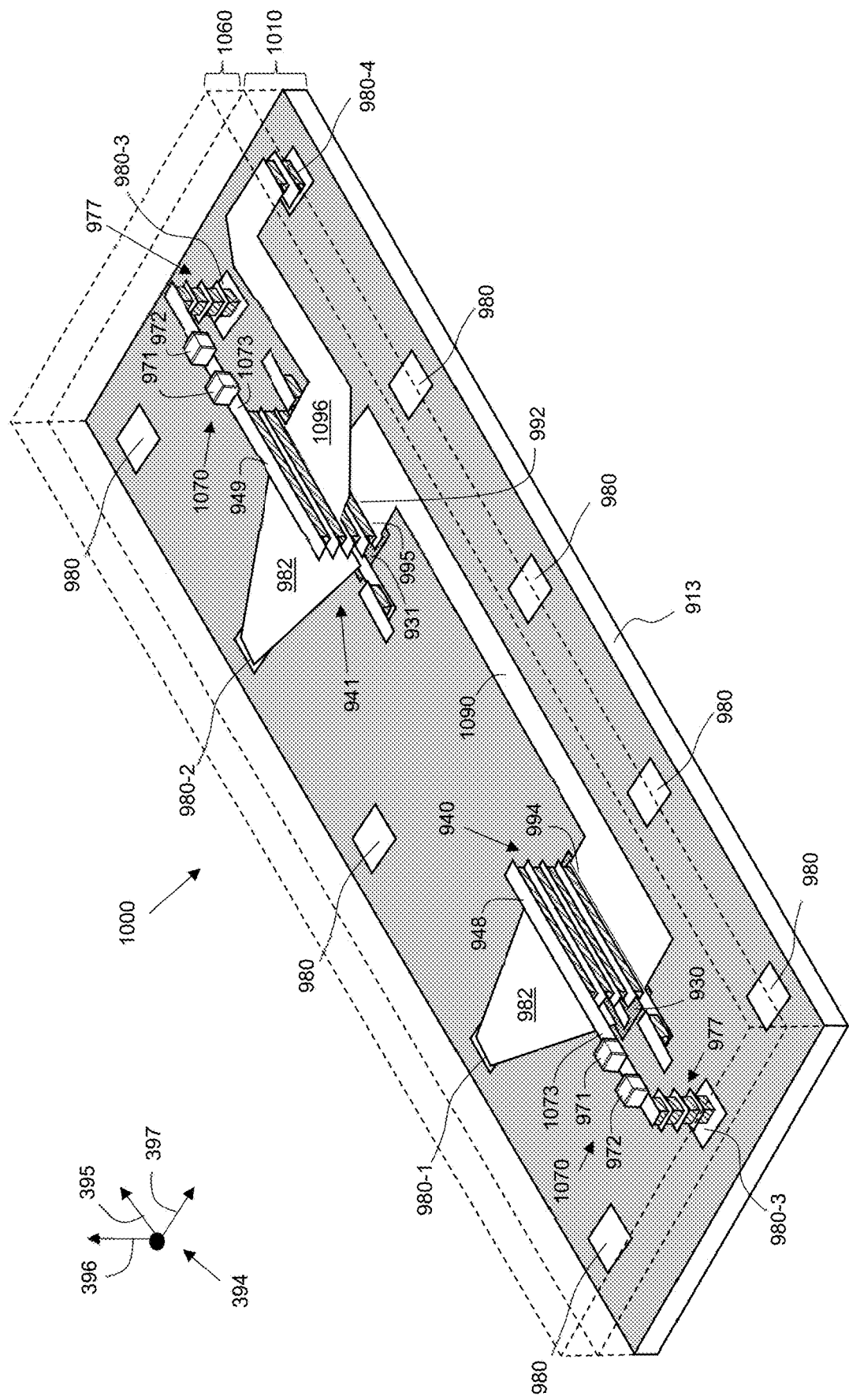
FIG. 10 is a perspective, cut-away view of a multi-path power amplifier device, according to another example embodiment.

All or a portion of Doherty power amplifier 800 may be housed within a multi-path power amplifier device, and dashed box 899 indicates an example subset of the amplifier elements that may be housed within particular embodiments of a power amplifier device (e.g., devices 900, 1000, FIGS. 9A, 10). It would be apparent to one of skill in the art, based on the description herein, that alternate device embodiments may house more elements (e.g., elements 803, 882) or fewer elements (e.g., some or all of elements 810, 812, 820, 824, 860, 861 may be excluded from amplifier 800 or housed outside of device 899, such as a PCB on which device 899 is mounted).

Input terminal 801, which is configured to receive an RF signal for amplification, is coupled to power divider 803. Power divider 803 includes an input terminal 805 and two output terminals 806, 807. An input RF signal received at input terminal 801 is conveyed to the input terminal 805 of the power divider 803, which divides the power of the input RF signal into carrier and peaking portions of the input signal. The carrier input signal is provided at power divider output 806, and the peaking input signal is provided at power divider output 807. During operation in a full-power mode when both the carrier and peaking amplifiers 830, 831 are supplying current to the load 898, the power divider 803 divides the input signal power between the amplifier paths 808, 809. For example, the power divider 803 may divide the power equally, such that roughly one half of the input signal power is provided to each path 808, 809 (e.g., for a symmetric Doherty amplifier configuration). Alternatively, the power divider 803 may divide the power unequally (e.g., for an asymmetric Doherty amplifier configuration).

The carrier signal produced at power divider output 806 is provided to the carrier amplifier path 808 of amplifier device 899 at carrier input terminal 802-1. Similarly, the peaking signal produced at power divider output 807 is provided to the peaking amplifier path 809 of amplifier device 899 at peaking input terminal 802-2. The carrier and peaking signals are separately amplified along the carrier and peaking amplifier paths 808, 809, respectively. The amplified carrier and peaking signals are then combined in phase at the combining node 892. It is important that phase coherency between the carrier and peaking amplifier paths 808, 809 is maintained across a frequency band of interest to ensure that the amplified carrier and peaking signals arrive in phase at the combining node 892, and thus to ensure proper Doherty amplifier operation. This phase coherency is provided, at least in part, by phase delay elements 890, 882, which will be discussed in more detail below.

Each of the carrier amplifier and peaking amplifier paths 808, 809 includes one or more single-stage or multiple-stage power transistor integrated circuits (ICs) (e.g., power transistor dies 930, 931, FIGS. 9A-C, 10, 13) for amplifying the RF signals conducted through each amplifier path. For example, in each path, a single amplifier stage may be integrated into each power transistor IC, or alternatively, a pre-amplifier stage and a final amplifier stage may be integrated into each power transistor IC. Alternatively, the pre-amplifier and final amplifier stages may be integrated into two separate power transistor ICs that are connected in series. According to various embodiments, all amplifier stages or a final amplifier stage of either or both the carrier amplifier 830 and/or the peaking amplifier 831 may be implemented, for example, using a III-V field effect transistor (e.g., a HEMT), such as a GaN FET (or another type of III-V transistor, including a GaAs FET, a GaP FET, an InP FET, or an InSb FET). Where only one stage of the carrier amplifier 830 or one stage of the peaking amplifier 831 is implemented as a III-V FET, the other amplifier stage may be implemented as a silicon-based FET (e.g., an LDMOS FET) or a silicon germanium (SiGe) FET, in some embodiments. In still other embodiments, some or all of the amplifier stages may be implemented using silicon-based LDMOS (laterally diffused metal oxide semiconductor) transistors, SiGe transistors, or other types of transistors.

Although the carrier and peaking power transistor ICs may be of equal size (e.g., in a symmetric Doherty configuration), the carrier and peaking power transistor ICs may have unequal sizes, as well (e.g., in various asymmetric Doherty configurations). In an asymmetric Doherty configuration, the peaking power transistor IC(s) typically are larger than the carrier power transistor IC(s) by some multiplier. For example, the peaking power transistor IC(s) may be twice the size of the carrier power transistor IC(s) so that the peaking power transistor IC(s) have twice the current carrying capability of the carrier power transistor IC(s). Peaking-to-main amplifier IC size ratios other than a 2:1 ratio may be implemented, as well.

During operation of Doherty amplifier 800, the carrier amplifier 830 is biased to operate in class AB mode, and the peaking amplifier 831 is biased to operate in class C mode. At low power levels, where the power of the input signal at terminal 801 is lower than the turn-on threshold level of peaking amplifier 831, the amplifier 800 operates in a low-power (or back-off) mode in which the carrier amplifier 830 is the only amplifier supplying current to the load 898. When the power of the input signal exceeds a threshold level of the peaking amplifier 831, the amplifier 800 operates in a high-power mode in which the carrier amplifier 830 and the peaking amplifier 831 both supply current to the load 898. At this point, the peaking amplifier 831 provides active load modulation at combining node 892, allowing the current of the carrier amplifier 830 to continue to increase linearly.

Optionally, input and output impedance matching networks 810, 860 (input MNc, output MNc) may be implemented at the input and/or output of the carrier amplifier 830. Similarly, input and output impedance matching networks 812, 861 (input MNp, output MNp) optionally may be implemented at the input and/or output of the peaking amplifier 831. In each case, the matching networks 810, 812, 860, 861 may be used to transform the gate and drain impedances of carrier amplifier 830 and peaking amplifier 831 to a more desirable system level impedance, as well as manipulate the signal phases to ensure proper Doherty amplifier operation. In various embodiments, all or portions of the input and output impedance matching networks 810, 812, 860, 861, if included, may be implemented inside the amplifier device 899. For example, various elements of the input and output impedance matching networks 810, 812, 860, 861 may be implemented as discrete components and/or IPDs (e.g., IPDs 720, 660, FIGS. 7, 6) within the device 899. In other embodiments, such as those depicted in FIGS. 9A-C and 10, the input and output impedance matching networks 810, 812, 860, 861 may be either excluded or implemented outside of the device 899.

Embodiments of device 899 also may include harmonic frequency termination circuits 820, 824 coupled between the inputs of amplifiers 830, 831 and a ground reference. In addition or alternatively, embodiments of device 899 may include shunt circuits 870, 874 (e.g., harmonic frequency termination and/or shunt-L circuits) coupled between the outputs of amplifiers 830, 831 and a ground reference. When included, the input-side harmonic frequency termination circuits 820, 824 are configured to control the harmonic impedance across a relatively wide fractional bandwidth. For example, the harmonic frequency termination circuits 820, 824 may provide a low impedance path to ground for signal energy at the second harmonic frequency, 2f0, of the fundamental frequency of operation of the amplifier 800. When the output-side shunt circuits 870, 874 are harmonic frequency termination circuits, they may be similarly configured. Alternatively, each circuit 870, 874 may be configured to function as a "shunt-L" circuit, which may improve the output impedances of the amplifiers 830, 831. In such a shunt-L circuit, an inductor (e.g., inductor 971, FIGS. 9A-C, 10) functions to resonate out the drain terminal-source terminal capacitance, Cds, of the final-stage power transistor within each amplifier 830, 831, and a capacitor (e.g., capacitor 972, FIGS. 9A-C, 10) functions as a DC blocking capacitor.

Doherty amplifier 800 has a traditional type of Doherty power amplifier topology with a non-inverting load network. For such a topology, the input circuit is configured so that an input signal supplied to the peaking amplifier 831 is delayed by 90 degrees with respect to the input signal supplied to the carrier amplifier 830 at the center frequency of operation, fo, of the amplifier 800. To ensure that the carrier and peaking input RF signals arrive at the carrier and peaking amplifiers 830, 831 with about 90 degrees of phase difference, as is fundamental to proper Doherty amplifier operation, phase delay element 882 applies about 90 degrees of phase delay to the peaking input signal. For example, phase delay element 882 may include a quarter wave transmission line, or another suitable type of delay element with an electrical length of about 90 degrees. Alternatively, the phase delay of 90 degrees may be produced by power divider 803.

The 90 degree phase delay difference between the carrier and peaking amplifier paths 808, 809 at the inputs of amplifiers 830, 831 compensates for a 90 degree phase delay applied to the signal between the output of carrier amplifier 830 and the combining node 892 (i.e., to ensure that the amplified signals arrive in phase at the combining node 892). This is achieved through an additional delay element 890, which also is configured to perform an impedance inversion (i.e., element 890 may be referred to as an impedance inverter/phase delay element or structure). Alternate embodiments of Doherty amplifier topologies may have an inverting load network. For such a topology, the input circuit is configured so that an input signal supplied to the carrier amplifier 830 is delayed by about 90 degrees with respect to the input signal supplied to the peaking amplifier 831 at the center frequency of operation, fo, of the amplifier 800. Additionally, the output circuit is configured so that an output signal supplied to the combining node 892 by the peaking amplifier 831 is delayed by about 90 degrees with respect to the carrier amplifier 830 at the center frequency of operation, fo, of the amplifier 800.

Figure 9B:
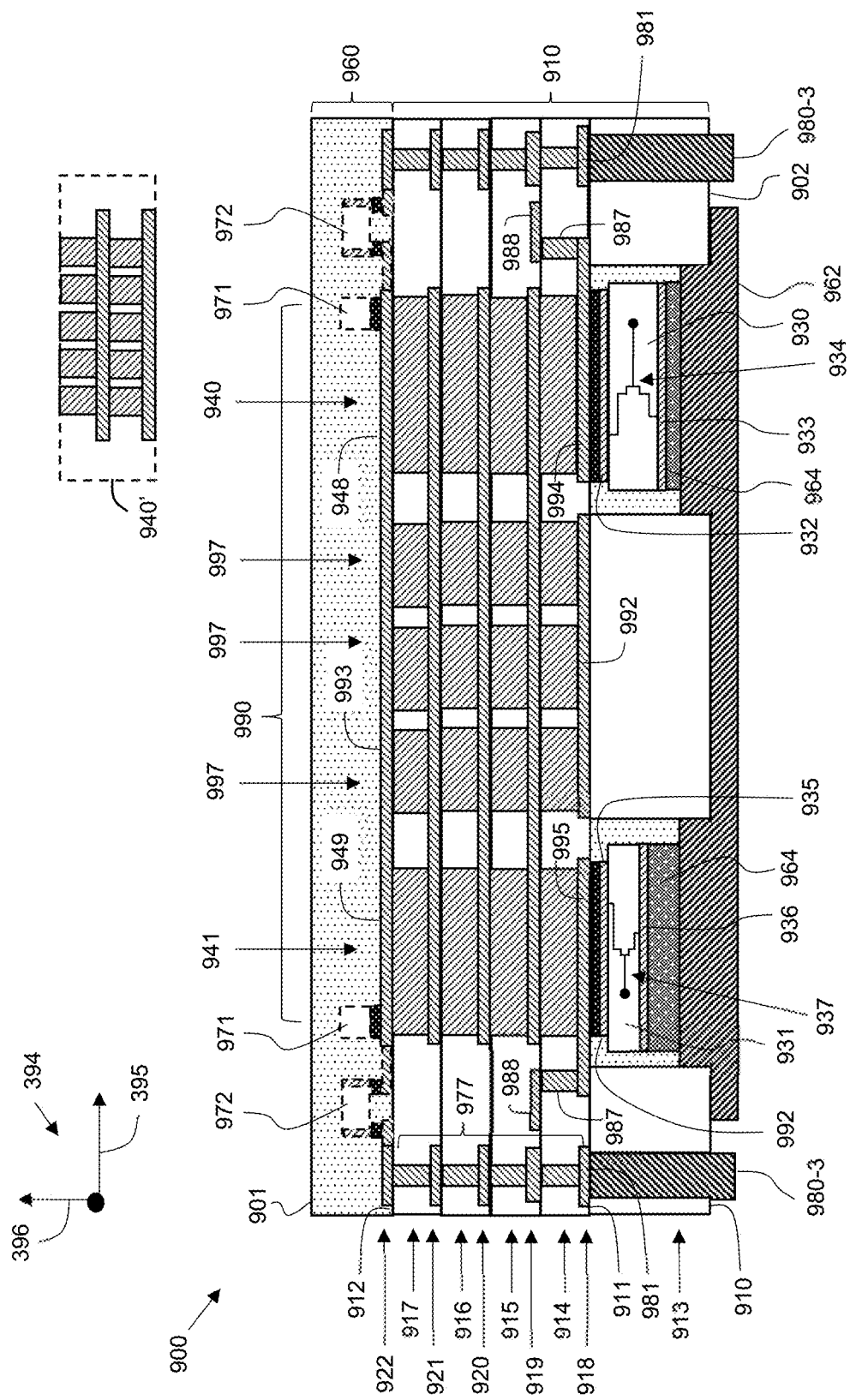
FIG. 9B is a side, cross-sectional view of the power amplifier device of FIG. 9A along bisection line 9B, according to an example embodiment.

FIG. 9A is a perspective, cut-away view of a power amplifier device 900 (e.g., another embodiment of power amplifier device 200, FIGS. 2A-B), according to an example embodiment. For enhanced understanding, FIG. 9A should be viewed in conjunction with FIG. 9B. In particular, FIG. 9B is a side, cross-sectional view of the power amplifier device 900 of FIG. 9A along bisection line 9B (i.e., a cross section through the drain bondpads 932, 935 of dies 930, 931), according to an example embodiment. In FIGS. 9A-B, the same Cartesian coordinate system 394 from FIG. 3 is illustrated, to provide an understanding of the orientations of the various elements of device 900, including an understanding of the orientation of the power transistor dies 930, 931 (e.g., two instances of power transistor die 300, FIG. 3) with respect to the other elements of device 900.

The circuitry housed within power amplifier device 900 is similar to the circuitry shown in box 899 of the Doherty power amplifier 800 of FIG. 8, except that device 900 does not, but could, include input impedance matching networks 810, 812, input-side harmonic termination circuits 820, 824, or output impedance matching networks 860, 861. In alternate embodiments, and similar to device 700 (FIG. 7), device 900 could provide all or portions of input impedance matching networks (e.g., networks 810, 812, FIG. 8) by including an input-side IPD (e.g., IPD 720, FIG. 7) between each conductive interconnect 980-1, 980-2 and the gate terminals of each power transistor die 930, 931. In other alternate embodiments, and also similar to device 700 (FIG. 7), device 900 could include input-side shunt LC circuits (e.g., circuits 770, FIG. 7) coupled to the gate terminals of each power transistor die 930, 931. The input-side shunt LC circuits could include, for example, harmonic termination circuits. In still other embodiments, input-side and/or output-side impedance matching components could be integrated within each power transistor die 930, 931.

As shown most clearly in FIG. 9B, power amplifier device 900 has a device body, which includes an encapsulation material layer 960 (e.g., layer 260, FIGS. 2A-B) connected to a substrate 910 (e.g., substrate 210, FIGS. 2A-B). The substrate 910 is formed from a stack of multiple dielectric layers 913, 914, 915, 916, 917 and multiple patterned conductive layers 918, 919, 920, 921, 922 in an alternating arrangement. Although FIGS. 9A-B depict four dielectric layers 913-917 and five patterned conductive layers 918-922, the substrate 910 may have more or fewer dielectric layers and/or patterned conductive layers. In the embodiment of power amplifier device 900 shown in FIG. 9B, layer 913 is a lower-most dielectric layer.

Figure 9C:
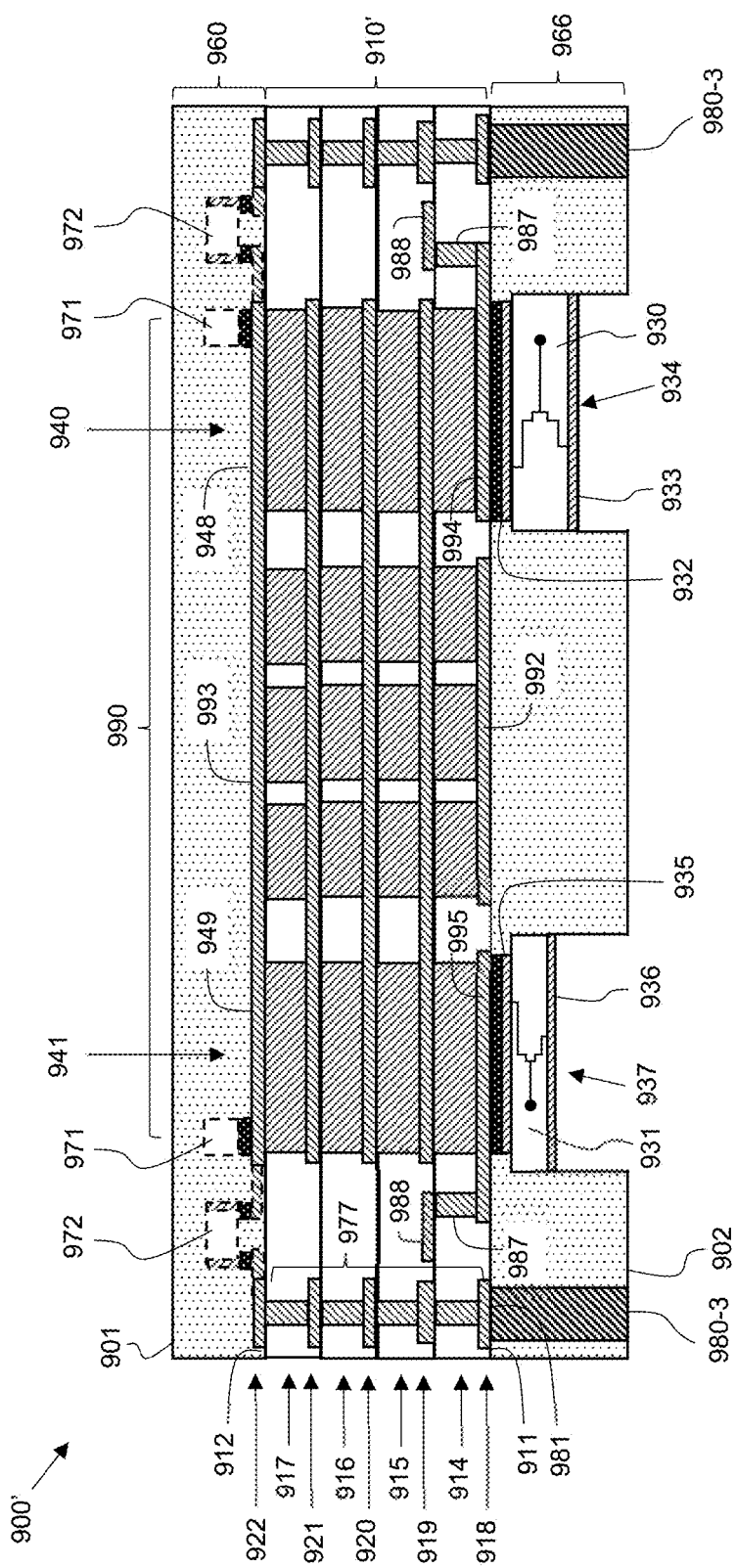
FIG. 9C is a side, cross-sectional view of the power amplifier device of FIG. 9A along bisection line 9B, according to another example embodiment.

Reference is briefly made to an alternate embodiment depicted in FIG. 9C, which is a side, cross-sectional view of an alternate embodiment of a power amplifier device 900', in which the lower-most dielectric layer 913 (FIGS. 9A-B) is replaced with a second encapsulation material layer 966. In other words, in device 900', substrate 910' does not include layer 913 (FIGS. 9A-B), but instead includes a second encapsulation material layer 966, which covers substrate surface 911 and the sidewalls of dies 930, 931. Other than this detail, the device 900' of FIG. 9C is substantially identical to the device 900 of FIGS. 9A-B, and the details and various embodiments discussed herein in conjunction with FIGS. 9A-B apply equally to the device 900' of FIG. 9C. In particular, elements labeled with the same reference number in FIGS. 9A-B and 9C are substantially identical, and all of the details and alternate embodiments described herein for such elements applies to all of the figures in which the reference numbers appear.

Referring again to FIGS. 9A-B, a plurality of conductive vias (e.g., via 987) electrically connect the patterned conductive layers 918-922. In the view of FIG. 9A, the encapsulation material layer 960 and dielectric layers 914-917 have been removed to more easily depict various structures associated with embodiments of the inventive subject matter. Of the dielectric layers 913-917, only dielectric layer 913 is depicted in FIG. 9A, along with other inventive features.

As shown in FIG. 9A, first and second elongated substrate die contacts 938, 939 (e.g., gate contacts) are exposed at an interior first substrate surface 911. As shown in both FIGS. 9A and 9B, third and fourth elongated substrate die contacts 994, 995 (e.g., drain contacts) also are exposed at the interior first surface 911. Essentially, the elongated substrate die contacts 938, 939, 994, 995 are conductive features of the substrate 910 that are suitable for attachment (e.g., solder or sinter attachment) to bondpads of carrier and peaking power transistor dies 930, 931 (e.g., to gate and drain bondpads 342, 340, FIG. 3, respectively).

The power transistor dies 930, 931, each of which may have a configuration similar or identical to power transistor die 300 (FIG. 3), are coupled to the interior first substrate surface 911. The first substrate surface 911 is recessed below the lower device surface 902, in the embodiment of FIG. 9B, and each of the dies 930, 931 may be inserted into an opening in the lower dielectric layer 913 that exposes the first substrate surface 911. Dielectric filler material (e.g., plastic encapsulant) may fill the gaps between the dies 930, 931 and sidewalls of the openings. A thermal structure 962 that extends into the die openings thermally couples to the embedded dies 930, 931 and extends outwardly to define a portion of the lower device surface 902. The thermal structure 962 provides a means for removing heat produced by the dies 930, 931 and also functions as a ground reference node for the source terminals of the transistors 934, 937 within dies 930, 931.

Power transistor die 930 includes a transistor 934 that may essentially function as the carrier amplifier (e.g., carrier amplifier 830, FIG. 8) of a Doherty power amplifier. Similarly, power transistor die 931 includes a transistor 937 that may essentially function as the peaking amplifier (e.g., peaking amplifier 831, FIG. 8) of the Doherty power amplifier. According to an embodiment, each power transistor die 930, 931 includes at least one integrated transistor (e.g., transistor 130 or 380, FIGS. 1, 3, such as a Si, GaN, SiGe, HEMT, LDMOS, or other transistor), which functions as the primary amplifying element of an amplifier path (e.g., of the carrier or peaking amplifier path 808, 809, FIG. 8). As discussed previously in conjunction with FIG. 3, the gate terminal (e.g., gate terminal 131, 381, FIGS. 1, 3) of each integrated transistor 934, 937 is connected to the gate bondpad, not illustrated (e.g., gate bondpad 340, FIG. 3) of each die 930, 931, respectively. As shown most clearly in FIG. 9B, the drain terminal (e.g., drain terminal 382, FIG. 3) of each integrated transistor 934, 937 is connected to a drain bondpad 932, 935 (e.g., drain bondpad 342, FIG. 3) of each die 930, 931, respectively. Additionally, the source terminal (e.g., source terminal 183, 383, FIGS. 1, 3) of each integrated transistor 934, 937 is connected to a conductive bottom layer 933, 936 at the lower surface of each die 930, 931, respectively.

In order to connect the dies 930, 931 to the substrate 910, the elongated gate bondpad (e.g., gate bondpad 340, FIG. 3) of each power transistor die 930, 931 is connected to an elongated substrate die contact 938, 939 (FIG. 9A), and the elongated drain bondpad 932, 935 (e.g., drain bondpad 342, FIG. 3) of each power transistor die 930, 931 is connected to an elongated substrate die contact 994, 995. In this manner, the dies 930, 931 are connected to the first substrate surface 911.

The gate and drain bondpads may be coupled to the substrate die contacts 938, 939, 994, 995 using solder, sinter, conductive epoxy, or other conductive connections. As described in detail in conjunction with FIG. 3, the gate and drain bondpads of dies 930, 931 are elongated bondpads, according to an embodiment, meaning that their lengths are significantly greater than their widths, and/or that their lengths are at least 50 percent the width of each die 930, 931.

According to a further embodiment, each of the die contacts 938, 939, 994, 995, which are exposed at surface 911 of the substrate 910, are shaped and sized to correspond to the shape and size of the gate or drain bondpad to which the substrate die contact 938, 939, 994, 995 is connected. In other words, the substrate die contacts 938, 939, 994, 995 also are elongated. Accordingly, in the plane defined by axes 395 and 397 of coordinate system 394, the substrate die contacts 938, 939, 994, 995 may have two-dimensional shapes and sizes that are substantially similar or identical to the two-dimensional shapes and sizes of the bondpads (e.g., bondpads 340, 342, 932, 935) to which they are connected. This ensures good connection to the substrate die contacts 938, 939, 994, 995 along the entire lengths of the gate and/or drain bondpads (i.e., the dimension parallel to axis 395), or at least along substantial portions (e.g., 50-90 percent) of the lengths of the gate and/or drain bondpads. This is shown most clearly in FIG. 9B, where drain bondpads 932, 935 of dies 930, 931 are connected across their entire bondpad lengths to die contacts 994, 995 (e.g., using solder, sinter, conductive epoxy, etc.). During operation of device 900, this enables equal power distribution across the connections between the elongated drain bondpads of dies 930, 931 and the elongated substrate die contacts 994, 995. Although not shown in FIGS. 9A-B, the gate bondpads of dies 930, 931 are similarly connected to substrate die contacts 938, 939.

Additional aspects of the device 900 will now be discussed. Referring to FIG. 9B, for example, the above-mentioned thermal structure 962 extends into the openings of the outermost substrate layer(s) 913, and is coupled (e.g., using die attach 964, solder, or other suitable conductive materials) to the conductive bottom layers 933, 936 of the power transistor dies 930, 931, in an embodiment. The outer surface of the thermal structure 962 corresponds to a portion of the lower surface 902 of the device 900. As will be explained in more detail later, the thermal structure 962 is configured to convey heat generated by the dies 930, 931 away from the dies 930, 931, and to an external system heat sink (e.g., heat extraction component 1230, 1330, FIGS. 12, 13) associated with an amplifier system (e.g., a transmitter of a communication system).

As mentioned initially when describing FIG. 2B, a plurality of conductive interconnects 980 (e.g., interconnects 280, FIG. 2B), including interconnects 980-1, 980-2, 980-3, and 980-4, have distal ends exposed at the lower device surface 902. Accordingly, the lower device surface 902 may be considered a contact surface of the device 900. The conductive interconnects 980 extend through the outermost substrate layer(s) 913, and their proximal ends are electrically connected to the patterned conductive layers 918-922 of the substrate 910. These connections may be made through interconnect contacts (e.g., contacts 981, FIG. 9B). For example, the interconnect contacts 981 may be positioned at the first substrate surface 911. As mentioned previously, the conductive interconnects 980 (e.g., interconnects 280, FIG. 2B) are configured to convey RF signals, bias voltages, control signals, and ground connections to the amplifier circuitry (e.g., dies 930, 931 and surface mount components 971, 972) embedded within the device 900.

In FIG. 9A, conductive interconnects 980-1 and 980-2 more specifically correspond to carrier and peaking RF input terminals (e.g., terminals 802-1, 802-2, FIG. 8), respectively, and thus are referred to as carrier and peaking RF input interconnects 980-1, 980-2. Carrier RF input interconnect 980-1 is coupled through the substrate 910 to the die contact 938 (and thus to the gate bondpad of die 930), and peaking RF input interconnect 980-2 is coupled through the substrate 910 to the die contact 939 (and thus to the gate bondpad of die 931). For example, the RF input interconnects 980-1, 980-2 may be coupled to die contacts 938, 939, respectively, through first vias (not numbered) that extend from interconnects 980-1, 980-2 through dielectric layer 914 to the proximal ends of conductive input elements 982, through the conductive input elements 982, and through second vias (not numbered) that extend from the distal ends of conductive input elements 982 through dielectric layer 914 to the substrate die contacts 938, 939. As shown in FIG. 9A, the conductive input elements 982 may be tapered to transition from a first width at their proximal ends to a second and larger width at their distal ends, and the second vias may be elongated vias with lengths approximately equal to the width of each conductive input element 982 at its distal end. For example, the distal-end width of each conductive input element 982, and the widths of the second vias, may be approximately equal to the width of the elongated substrate die contacts 938, 939, respectively. In an alternate embodiment, the elongated second vias may be replaced with rows of multiple narrower vias. Either way, during operation of device 900, this enables equal power distribution across the substrate die contacts 938, 939 and the gate bondpads of each die 930, 931 (e.g., gate bondpad 340, FIG. 3). In other words, the elongated configurations of the distal ends of conductive input elements 982, the second vias, and die contacts 938, 939 provide uniform RF power feeds to the gate bondpads of dies 930, 931.

With continued reference to FIG. 9A, in some embodiments, additional conductive traces (not numbered), formed from portions of conductive layer 918, may extend beyond one or both ends of the gate-side die contacts 938, 939 to enable additional conductive vias (not numbered) within substrate 910 to be directly connected to the die contacts 938, 939 (and thus closely coupled to the gate bondpads of dies 930, 931). Through additional patterned portions of the overlying conductive layers and additional conductive vias, these additional conductive vias may be electrically connected to interconnects 980 and/or various other circuits integrated within the device 900 (e.g., bias circuits, harmonic frequency termination circuits, control circuits, and so on).

On the output side of device 900, the drain bondpad 932, 935 (FIG. 9B) of each die 930, 931 is connected to a drain-side die contact 994, 995, as discussed above. Similar to the input side, in some embodiments, additional conductive traces (not numbered), formed from portions of conductive layer 918, may extend beyond one or both ends of the drain-side die contacts 994, 995 to enable additional conductive vias 987 within substrate 910 to be directly connected to the die contacts 994, 995 (and thus closely coupled to the drain bondpads 932, 935 of dies 930, 931). Through additional patterned portions 988 of the overlying conductive layers and additional conductive vias, these additional conductive vias 987 may be electrically connected to interconnects 980 and/or various other circuits integrated within the device 900 (e.g., bias circuits, harmonic frequency termination circuits, control circuits, and so on).

Referring also to FIG. 8, and according to an embodiment, the combining node 992 (e.g., combining node 892, FIG. 8) for the Doherty amplifier partially embodied in device 900 is located at or near the drain bondpad 935 of the peaking die 931, and thus the combining node 992 is located at or near the drain-side die contact 995. To electrically couple the drain bondpad 932 of the carrier die 930 to the combining node 992, the drain-side die contacts 994, 995 are coupled to opposite ends of an impedance inverter/phase delay structure 990 (e.g., element 890, FIG. 8), which extends between the drain-side die contacts 994, 995.

As explained above in conjunction with FIG. 8, an approximately 90 degree phase delay is applied by element 890 to an RF carrier signal between the output of carrier amplifier 830 and the combining node 892 (i.e., to ensure that the amplified carrier and peaking signals arrive in phase at the combining node 892). In the device 900 of FIG. 9, this is achieved through impedance inverter/phase delay structure 990. Said another way, structure 990 functions as a phase delay element to impart a phase delay (e.g., about a 90 degree delay) to a carrier RF signal traveling between die contact 994 and the combining node 992 (e.g., die contact 995), while also performing an impedance inversion.

The impedance inverter/phase delay structure 990 comprises three portions, in an embodiment. These three portions include first and second vertical interconnect structures 940, 941, and one or more stacks of vias/conductive pads 997 connected between the vertical interconnect structures 940, 941. Each vertical interconnect structure 940, 941 has a structure substantially similar to the previously-described vertical interconnect structure 440 (FIG. 4), and the various details and different embodiments associated with the description of structure 440 applies also to vertical interconnect structures 940, 941. Each vertical interconnect structure 940, 941 extends through substrate 910 in a direction perpendicular to substrate surface 911 (i.e., in a direction parallel to axis 396 of coordinate system 394). Essentially, the vertical interconnect structures 940, 941 provide electrical connections between the drain-side die contacts 994, 995 (and thus the drain bondpads 932, 935) and an upper surface 912 of the substrate 910.

Each vertical interconnect structure 940, 941 includes a stack of multiple elongated vias (not numbered), which extend through dielectric layers 914-917. The elongated vias are interleaved with multiple elongated conductive layer portions, including bottom conductive layer portions corresponding to the drain-side die contacts 994, 995 at the lower surface 911 of substrate 910, top conductive layer portions 948, 949 at the upper surface 912 of substrate 910, and intervening conductive layer portions (not numbered). The various die contacts and conductive layer portions 994, 995, 948, 949 (and intervening conductive layer portions) are formed from portions of the multiple patterned conductive layers 918-922. In the embodiment illustrated in FIGS. 9A-B, the elongated vias are stacked directly over each other (i.e., aligned along an axis extending parallel to axis 396). In an alternate embodiment, the vias may be offset from each other (i.e., not stacked directly on top of each other) between substrate surface 911 and substrate surface 912.

Further, although FIGS. 9A-B show vertical interconnect structures 940, 941 with four elongated vias and five conductive layer portions (including portions 994, 995, 948, 949), in other embodiments (e.g., embodiments with more or fewer dielectric layers 914-917 and/or conductive layers 918-922), the vertical interconnect structures 940, 941 may have more or fewer elongated vias and/or conductive layer portions. Further still, in some embodiments, some or all of the elongated vias may be replaced with a row of vias, as shown in box 940' in the upper right corner of FIG. 9A.

The vertical interconnect structures 940, 941, which are electrically connected through the stack(s) of vias/conductive pads 997, complete the impedance inverter/phase delay structure 990. Each of the stacks 997 may include one or more conductive vias (not numbered) interleaved with conductive layer portions. In the illustrated embodiment, each via within the stacks 997 is an elongated trench-type via. In other embodiments, some or all of the elongated trench-type vias could be replaced with one or multiple smaller (e.g., circular) vias.

In the embodiment illustrated in FIG. 9B, the stacks 997 extend from a lowest conductive layer portion 992 at surface 911 of substrate 910 to a highest conductive layer portion 993 at surface 912 of substrate 910. Thus, each stack 997 extends from a lowest conductive layer 918 to a highest conductive layer 922 through all of the dielectric layers 914-917 of the substrate 910. In alternate embodiments, each stack 997 may extend through fewer than all dielectric layers 914-917. For example, in one alternate embodiment, each stack 997 may extend through only a single dielectric layer (i.e., any one of layers 914-917), while in another alternate embodiment, each stack 997 may extend through two or more dielectric layers (e.g., any combination of two or more of dielectric layers 914-917). Either way, each stack 997 is electrically connected between the vertical interconnect structures 940, 941.

Referring also to FIG. 10, which illustrates an alternate embodiment of a power amplifier device 1000, the stacks 997 of vias/conductive pads within substrate 1010 may be replaced by an impedance inversion/phase delay trace 1090, which may be formed from a single conductive portion of any of layers 918-922 (or from multiple interconnected portions of layers 918-922). More particularly, trace 1090, which corresponds to the impedance inverter/phase delay element 890 (FIG. 8), extends between and electrically interconnects vertical interconnect structures 940, 941. Trace 1090 functions to impart about a 90 degree phase delay to the amplified RF carrier signal between the drain bondpad 932 of die 930 and the combining node 992, while also providing an impedance inversion.

As can be readily seen in FIG. 10, the proximal end of trace 1090 is elongated, thus providing an elongated connection to vertical interconnect structure 940 and the elongated die contact 994 and drain bondpad 932 of die 930. Similarly, the distal end of trace 1090 is elongated, thus providing an elongated connection to vertical interconnect structure 941 and the elongated die contact 995 and drain bondpad 935 of die 931. Further, trace 1090 extends from its proximal and distal ends in an orthogonal direction (i.e., along axes that are parallel to axis 397 of coordinate system 394) from vertical interconnect structures 940, 941.

Referring to all of FIGS. 9A-C and 10, the configuration of the vertical interconnect structure 941 provides for multiple elongated electrical connections to the combining node 992/drain bondpad 935 of the peaking amplifier die 931. According to an embodiment, a conductive output element 996, 1096 (e.g., output conductor 896, FIG. 8), which may be formed from a patterned portion of any one of the conductive layers 918-921, electrically connects vertical interconnect structure 941 (and thus the combining node 992) to an RF output terminal (e.g., conductive RP output interconnect 980-4, which corresponds to RF output terminal 804, FIG. 8).

As best shown in FIG. 10, the conductive output element 996, 1096 has an elongated proximal end coupled to (connected to) a conductive layer portion of structure 941, which in turn is connected to substrate die contact 995. In some embodiments, substrate die contact 995 and output element 996, 1096 may both form portions of conductive layer 918. In other embodiments, such as that shown in FIG. 10, the proximal end of the conductive output element 996, 1096 may be connected to any other one of the conductive layer portions forming vertical interconnect structure 941, and thus the conductive output element 996, 1096 may be formed from a portion of another one of the conductive layers 919-922. In other words, the conductive output element 996, 1096 may, for example, be formed from a same conductive layer as the conductive layer portion of structure 941 to which it is connected. Thus, the conductive layer portion of structure 941 and the conductive output element 996, 1096 may be integrally connected (e.g., forming portions of a same conductive structure). A distal end of the conductive output element 996, 1096 is coupled to RF output interconnect 980-4 either directly or through one or more vias.

As also shown in FIGS. 9A and 10, the conductive output element 996, 1096 may be tapered to transition from a first width at its proximal end to a second width at its distal end. For example, the first width of the conductive output element 996, 1096 may be approximately equal to the width of the elongated substrate die contact 995. Accordingly, during operation of device 900, 1000, this enables equal power distribution across drain bondpad 935 of die 931, the substrate die contact 995, and the elongated vias and conductive layer portions of structure 941. In other words, the elongated configuration of the proximal end of conductive output element 996, 1096, structure 941, and die contact 995 provides a uniform RF power termination to the drain bondpad 935 of die 931. In addition, as can be seen in FIGS. 9A and 10, the conductive output element 996, 1096 extends from its proximal end along an axis that is parallel to axis 397 of coordinate system 394, which also is perpendicular to (orthogonal to) the direction that the vertical interconnect structure 941 extends (i.e., a direction parallel to axis 396 of coordinate system 394).

According to an embodiment, one or more additional circuits 970, 1070 are electrically coupled to the vertical interconnect structures 940, 941. These additional circuits 970, 1070 have components that are physically coupled to the upper substrate surface 912 and electrically coupled to the vertical interconnect structures 940, 941. The circuits 970, 1070 each may include at least one passive component (e.g., at least one inductor, capacitor, and/or resistor), which may be embodied as one or more surface mount components, integrated passive devices, or flip-chip components. As shown in FIGS. 9A-C and 10, identical first and second circuits 970, 1070 have proximal ends that are directly connected to the top conductive layer portions 948, 949 of the vertical interconnect structures 940, 941, respectively. In other embodiments, the proximal ends of circuits 970, 1070 may be directly connected to a different one of the conductive layer portions (e.g., using additional vias through one or more of the dielectric layers 914-917). Distal ends of the circuits 970, 1070 are electrically coupled to interconnects 980-3 through conductive stacks 977 of vias/conductive pads that extend through the substrate 910, 1010.

According to an embodiment, each circuit 970, 1070 is a shunt circuit (e.g., shunt circuits 870, 874, FIG. 8) electrically coupled between the vertical interconnect structures 940, 941 (and thus the drain terminals 932, 935 of the power transistor dies 930, 931) and an interconnect 980-3 (e.g., one of interconnects 280, FIG. 2B). When incorporated into a larger system, interconnects 980-3, in turn, may be coupled to a ground reference, thus establishing circuits 970, 1070 as shunt circuits. According to an embodiment, each shunt circuit 970, 1070 is a series LC circuit formed from a discrete, surface mount inductor 971 (e.g., inductance 171, FIG. 1) coupled in series with a discrete, surface mount capacitor 972 (e.g., capacitor 172, FIG. 1, capacitor 472, FIG. 4, or a radial stub 572, FIG. 5).

To provide the electrical connections between the vertical interconnect structure 940, inductor 971, capacitor 972, and interconnect 980-3, various conductive traces may be formed at the upper surface 912 of the substrate 910, 1010 (e.g., from portions of conductive layer 922). In the embodiment of FIGS. 9A-B, first conductive traces 973 at upper surface 912 of substrate 910 extend perpendicularly from the vertical interconnect structures 940, 941 (e.g., traces 973 extend from conductive layer portions 948, 949 in a direction parallel to axis 397), and a first terminal of each inductor 971 is connected to each first conductive trace 973. In the embodiment of FIG. 10, first conductive traces 1073 at the upper surface of substrate 1010 essentially are conductive extensions from the ends of conductive layer portions 948, 949 of vertical interconnect structures 940, 941 (i.e., traces 1073 extend along axes that are parallel to axis 395). A second conductive trace at upper surface 912 extends between a second terminal of each inductor 971 and a first terminal of capacitor 972. A third conductive trace at upper surface 912 extends between a second terminal of each capacitor 972 and a conductive stack 977. The inductor 971 and the capacitor 972 may be coupled to the traces (and to the upper surface 912) using, for example, solder, sinter material, conductive epoxy, or other conductive attachment means.

Circuit(s) 970, 1070 may have any of a number of functions. For example, each circuit 970, 1070 may be configured to function as a harmonic frequency termination circuit, which provides a low impedance path to ground for signal energy at the second harmonic frequency, 2f0, of the fundamental frequency of operation of the device 900, 1000 (i.e., each circuit 970, 1070 may be an LC circuit in which the combination of the inductor 971 and the capacitor 972 resonate at or near the second harmonic frequency). In other embodiments, each circuit 970, 1070 may have another function. For example each circuit 970, 1070 may form a portion of an output impedance matching network. Alternatively, each circuit 970, 1070 may be configured to function as a "shunt-L" circuit that may improve the output impedances at the RF output terminal 980-4 of the device 900, 1000. In a shunt-L circuit, the inductor 971 functions to resonate out the drain terminal-source terminal capacitances, Cds, of the power transistors within power transistor dies 930, 931, and the capacitors 972 are DC blocking capacitors. In various embodiments, additional circuitry (e.g., baseband decoupling circuitry), not illustrated, may be coupled to the conductive traces between inductors 971 and capacitors 972.

In still other embodiments, each circuit 970, 1070 may include additional or different discrete passive and/or active components and/or may have different functionalities.

An encapsulation material layer 960, 1060 (e.g., layer 260, FIGS. 2A-B) covers the surface mount components 971, 972 and the second substrate surface 912. The encapsulation material layer 960, 1060 essentially defines the upper device surface 901. According to an embodiment, sidewalls of the substrate 910, 1010 and sidewalls of the encapsulation material layer 960, 1060 are co-planar.

During operation, input carrier and peaking RF signals are received at RF input connectors 980-1, 980-2, respectively, and the RF signals are conveyed through conductive input elements 982, and die contacts 938, 939 to the gate bondpads (e.g., gate bondpad 340, FIG. 3) of the power transistor dies 930, 931. The power transistor within die 930 amplifies the received carrier signal to produce an amplified RF carrier signal at its drain bondpad 932. Similarly, the power transistor within die 931 amplifies the received peaking signal to produce an amplified RF peaking signal at its drain bondpad 935. The amplifier RF carrier signal is conveyed from the drain bondpad 932 through the substrate die contact 994 and the impedance inverter/phase delay structure 990, 1090 to the combining node 992, where the amplified RF carrier and peaking signals combine.

The combined RF carrier and peaking signals are then conveyed through vertical interconnect structure 941 to the conductive output element 996, 1096. The conductive output element 996, 1096, in turn, conveys the amplified RF signal to the RF output interconnect 980-4. In addition, circuits 970, 1070 coupled to the vertical interconnect structures 940, 941 provide additional electrical functionality (e.g., harmonic termination, shunt-L, and so on). Gate and/or drain bias voltages may be received through additional vias (e.g., vias 987) and patterned portions (e.g., portions 988) of the conductive layers 919-921, in an embodiment, or through additional connections to the vertical interconnect structures 940, 941, in other embodiments.

Accordingly, the power amplifier devices 900, 1000 illustrated in FIGS. 9A-C and 10 may encompass a substantial portion of a Doherty amplifier circuit in a compact package. It may be noted that no wirebond arrays are used to interconnect the components of the Doherty amplifier. Therefore, in comparison with conventional Doherty amplifier circuits, the lack of wirebond arrays may result in increased amplifier power and efficiency. In addition, the elongated contacts 938, 939, 994, 995 coupled to the gate and drain bondpads of the dies 930, 931 facilitate even power distribution across those connections. Further, minimized inductances inherent in the Doherty device embodiments described herein may enable compliance with higher band specifications.

Figure 11:
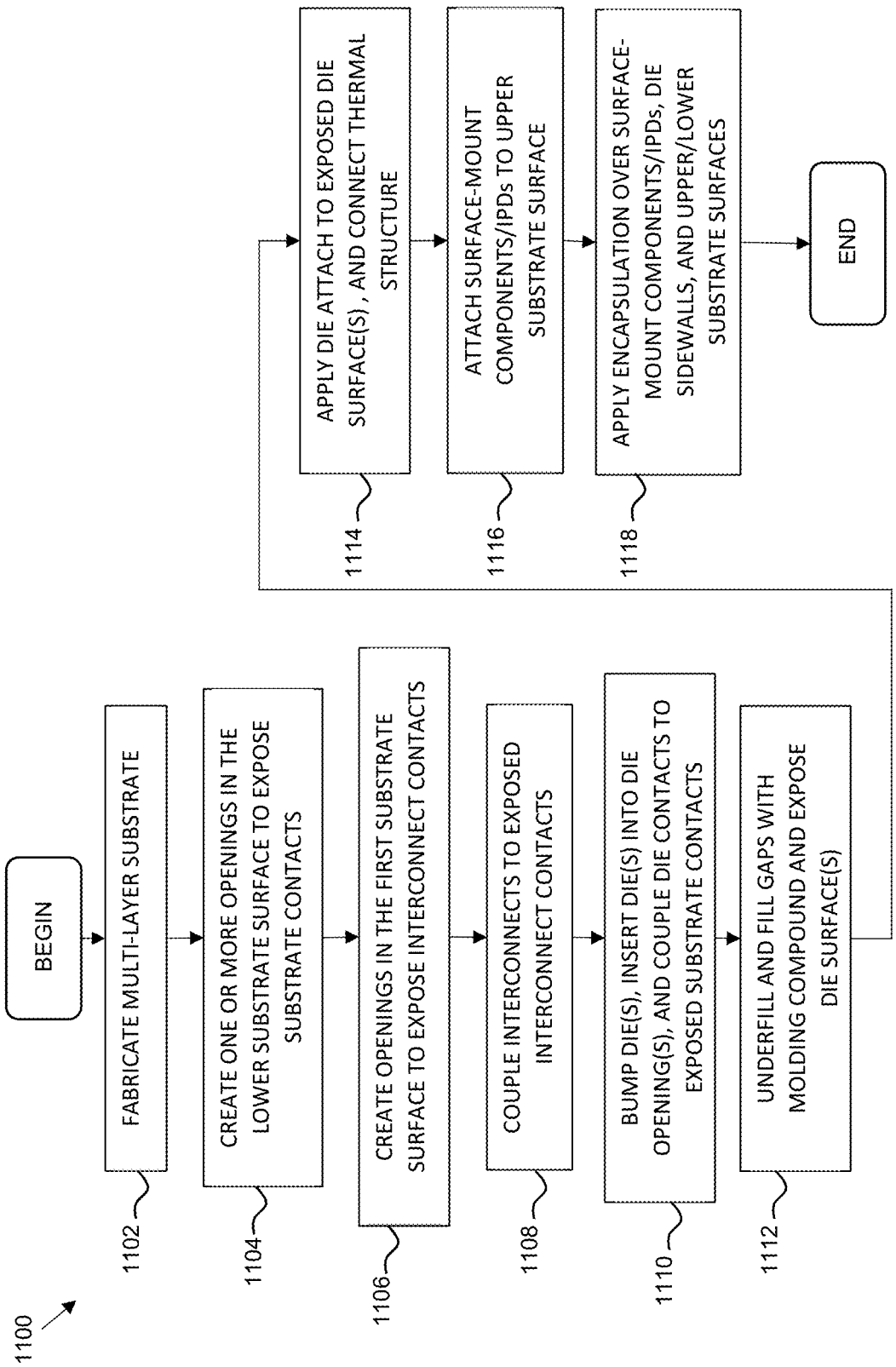
FIG. 11 is a flowchart of a method of manufacturing the power amplifier device of FIGS. 4A and 9A, according to an example embodiment.

FIG. 11 is a flowchart of a method 1100 of manufacturing the power amplifier devices 200, 400, 400', 500, 600, 700, 900, 1000 of FIGS. 2A-B, 4A-C, 5, 6, 7, 9A-C, and 10, according to an example embodiment. The method begins, in step 1102, by fabricating a multi-layer substrate 210, 410, 410', 510, 610, 710, 910, 910', 1010. The substrate is formed from a stack of multiple dielectric layers 414-417, 914-917 and multiple patterned conductive layers 418-422, 918-922, which are built up in an alternating arrangement. The substrate is defined by a lower surface 411, 911, an upper surface 412, 912, and sidewalls extending between the lower and upper surfaces. For example, the dielectric layers 414-417, 914-917 may be formed from PCB dielectric materials (e.g., FR-4), ceramic, or other suitable dielectric materials. The patterned conductive layers 418-422, 918-922 are formed from conductive metals, which are patterned during the build-up process. Also during the build-up process, conductive vias are formed through the dielectric layers in order to connect various portions of adjacent patterned conductive layers.

Various conductive paths within the substrate 210, 410, 410', 510, 610, 710, 910, 910', 1010 (formed from various combinations of conductive layer portions and conductive vias) will provide for interconnections between dies and components, which will later be mounted to the substrate 210, 410, 410', 510, 610, 710, 910, 910', 1010. In addition, some of the conductive paths within the substrate may be configured to provide desired inductances and impedance transformations. For example, in devices 900, 900', 10000, a conductive path comprising vertical interconnect structures 940, 941 and either conductive stacks 997 or trace 1090 may form a phase delay and impedance inverter element (e.g., impedance inverter/phase delay structure 890, FIG. 8).

It should be noted that, although substrates 210, 410, 410', 510, 610, 710, 910, 910', 1010 are shown to include four dielectric layers 414-417, 914-917 and five conductive layers 418-422, 918-922, other embodiments of a substrate may include more or fewer dielectric layers and/or conductive layers.

Once completed, the substrate 210, 410, 410', 510, 610, 710, 910, 910', 1010 includes traces (e.g., traces 449, 473-475, 673-675, 685, 709, 716, 749, 773-775, 948, 949, 993, 973, 1073) which are exposed at the upper surface 412, 912 of the substrate. In addition, the substrate includes embedded substrate die contacts 445, 484, 938, 939, 994, 995 and embedded interconnect contacts 481, 981 at an internal, surface 411, 911 of the substrate.

In the embodiments best depicted in FIGS. 4B and 9B, the method continues, in step 1104, by creating one or more die openings through the lower substrate surface 410, 910 to expose substrate die contacts 445, 484, 938, 939, 994, 995 at the interior surface 411, 911 of the substrate. Additionally, in step 1106, interconnect openings are formed through the lower substrate surface 410, 910 to expose interconnect contacts 481, 981, which also may be located at the interior surface 411, 911. According to an embodiment, the openings may be formed using an etching process, which is timed to stop when the substrate and interconnect contacts 445, 481, 484, 938, 939, 981, 994, 995 are reached.

In step 1108, conductive interconnects 280, 480, 980 are physically and electrically coupled to the interconnect contacts 481, 981 exposed at surface 411, 911. In one embodiment, the conductive interconnects 280, 480, 980 are conductive posts that are soldered, brazed, or otherwise attached to the interconnect contacts 481, 981. In other embodiments, the conductive interconnects 280, 480, 980 may be formed by filling interconnect openings formed in dielectric layer 413, 913 with conductive material. In still other embodiments, the interconnects 280, 480, 980 may be portions of a leadframe (not shown). In still other embodiments, multiple interconnects 280, 480, 980 may be packaged side-by-side in one or more separate dielectric interposer structures (not shown), and the dielectric interposer structures may be inserted into larger interconnect openings that span multiple interconnect contacts 481, 981. As shown in FIG. 2B, the interconnect openings and the interconnect contacts 280 may be located adjacent to multiple sides of the device 200 (e.g., to all four sides, as shown, or to less than all four sides).

In step 1110, the power transistor dies 430, 930, 931 are "bumped," by applying solder paste to the die bondpads (e.g., to the input and output, or gate and drain, bondpads). The die bondpads and the solder paste on the die bondpads are brought into contact with corresponding substrate die contacts 445, 484, 938, 939, 994, 995. A solder reflow process may then be performed to solder-attach the die bondpads to the substrate die contacts 445, 484, 938, 939, 994, 995. In step 1112, dies 430, 930, 931 are underfilled, and gaps between the power transistor dies 430, 930, 931 and sidewalls of the die openings are then filled in with underfill material (e.g., plastic encapsulant material 464, FIG. 4B).

Referring now to FIGS. 4B and 9B and step 1114, electrically and thermally conductive die attach material 463 (e.g., solder paste, sinter paste, or other suitable materials) is applied to the outward facing surfaces of the dies 430, 930, 931, and more particularly to the conductive layers 433, 933, 936 of the dies 430, 930, 931. In FIG. 9B, the thickness of the die attach material over each die 930, 931 may be different to account for differing heights of the dies 930, 931. Alternatively, the thickness of the die attach material over each die 930, 931 may be the same, and height differences may be accommodated by customizing the subsequently attached thermal structure 962.

The thermal structure 262, 462, 962 may be a simple conductive coin, or as illustrated in FIGS. 4B and 9B, may have a more complicated configuration. For example, the thermal structure 462, 962 may be a cast or machined piece of thermally conductive material (e.g., metal), which has a base and one or more pedestals, where multiple pedestals may be used to establish equal or differing thicknesses across the thermal structure 962. In the embodiment illustrated in FIG. 9B, the pedestals have equal heights (vertical dimension in FIG. 9B). In other embodiments, the multiple pedestals may have different heights. This may be desirable, for example, so that equal thickness of die attach material may be deposited on each die 930, 931, and the die height variation may be accommodated by the different-height pedestals.

The thermal structure 262, 462, 962 is then brought into contact with the die attach material. The device 200, 400, 500, 600, 700, 900, 1000 is then processed (e.g., by performing a reflow or sintering process) to securely connect the thermal structure 262, 462, 962 to the die(s) 430, 930, 931.

In step 1116, the terminals of one or more surface mount components 471, 472, 971, 972 and/or IPDs 660, 720 are coupled (e.g., solder-attached) to the traces that are exposed at the upper substrate surface 412, 912. As discussed previously, the surface mount components surface mount components 471, 472, 971, 972 and/or IPDs 660, 720 can correspond to a number of components of an amplifier circuit (e.g., pre-amplifier transistors, power splitting circuitry, harmonic termination circuitry, inductors, capacitors, and impedance matching circuitry). For example, surface mount components 471, 472, 971, 972 and/or IPDs 660, 720 may correspond to capacitors, inductors, or other circuit elements associated with impedance matching, harmonic termination, shunt-L circuits, and so on. Portions of the patterned conductive layers 418-422, 918-922 also may correspond to circuit elements associated with the impedance matching, harmonic termination, and shunt-L circuits. For example, various conductive traces and vias of layers 418-422, 918-922 may provide inductances of the impedance matching, harmonic termination, and shunt-L circuits. In addition, conductive stubs (e.g., radial stubs 572, FIG. 5) also may be formed from patterned portions of layers 418-422, 918-922.

The device 200, 400, 500, 600, 700, 900, 1000 is completed in step 1118 by applying an encapsulation material layer 260, 460, 560, 660, 760, 960, 1060 (e.g., molding compound) over substrate surface 412, 912 and the surface-mount components 471, 472, 971, 972 and/or IPDs 660, 720 coupled to the substrate surface 412, 912. The encapsulation material layer 260, 460, 560, 660, 760, 960, 1060 defines the upper surface 201, 401, 901 of the device 200, 400, 500, 600, 700, 900, 1000. In the embodiments of FIGS. 2B, 4B, and 9B, the lower surface of substrate 210, 410, 910 and the thermal structure 262, 462, 962 define the lower surface 202, 402, 902 of the device 200, 400, 900. In the embodiments of FIGS. 4C and 9C, the device 400', 900' is completed by applying an additional encapsulation material layer 466, 966 to the lower surface 411, 911 of the substrate 410', 910', and the sidewalls of dies 930, 931. In these embodiments, the lower surface of encapsulant 466, 966 defines the lower surface 402, 902 of the device 400', 900'.

Figure 12:
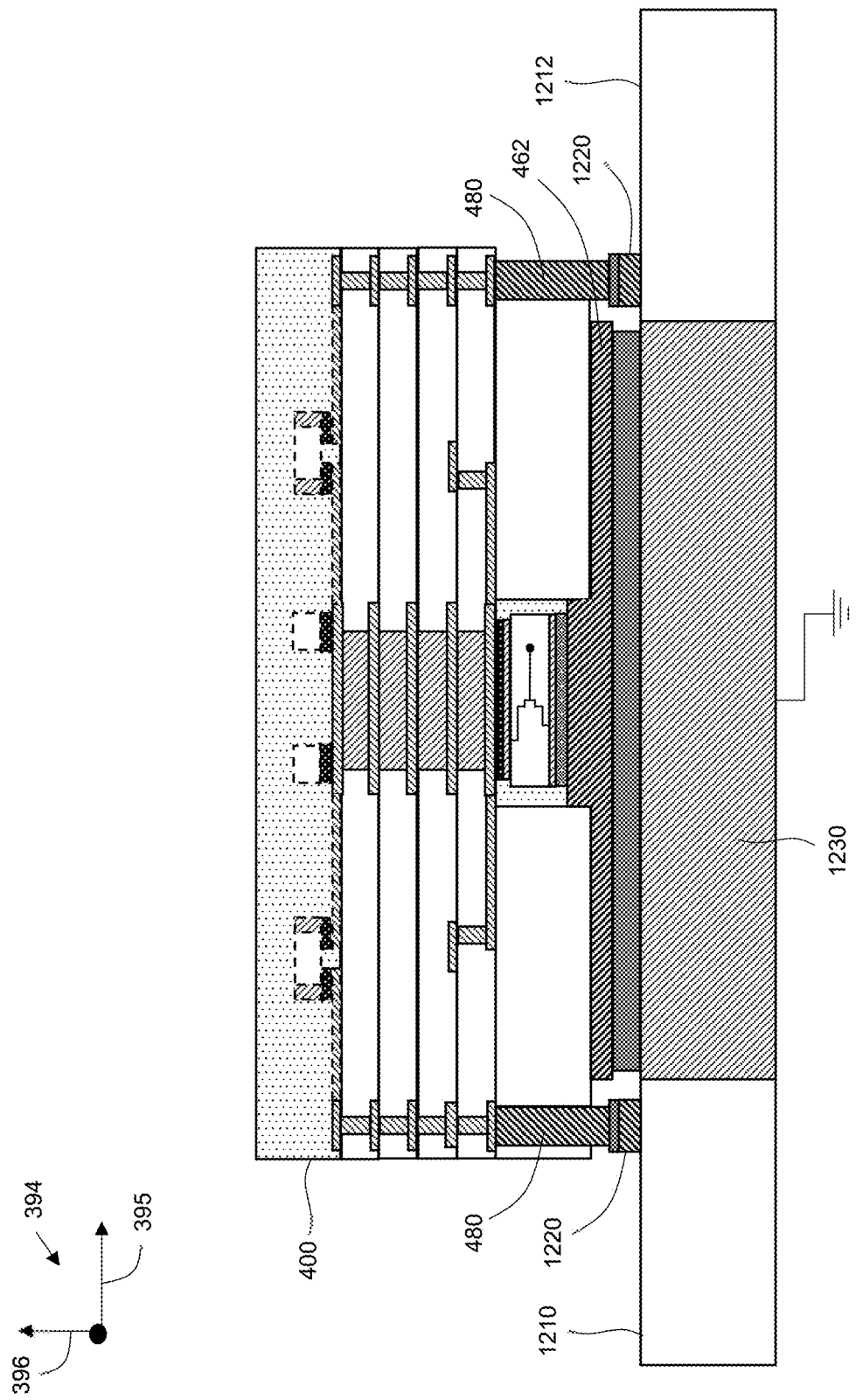
FIG. 12 is a side, cross-sectional view of the power amplifier device of FIGS. 4A-C coupled to a system substrate with bottom-side heat extraction, according to an example embodiment.

The above-described power amplifier devices 200, 400, 400', 500, 600, 700, 900, 900', 1000 may then be incorporated into a larger system (e.g., a transmitter and/or communication system). For example, FIG. 12 is side, cross-sectional view of the power amplifier device 400 of FIGS. 4A-B coupled to a system substrate 1210, according to an example embodiment. It should be noted here that power amplifier devices 400', 500, 600, 700, 900, 900', 1000 may be similarly coupled to a system substrate.

The system substrate 1210 may be, for example, a PCB with a plurality of contact pads 1220 at a top surface 1212. Although not shown in FIG. 12, the contact pads 1220 may be electrically coupled through additional traces on the substrate 1210 to other system components. According to an embodiment, a heat sink or heat extraction component 1230 (e.g., a conductive coin, thermal vias, or other thermally conductive component) is embedded within the system substrate 1210, and has an exposed upper surface proximate the top surface 1212 of the system substrate 1210.

Device 400 is physically and electrically coupled to the system substrate 1210. More particularly, and according to an embodiment, the thermal structure 462 of device 400 is physically, electrically, and thermally coupled to the heat extraction component 1230 of the system substrate 1210. For example, thermal structure 462 and heat extraction component 1230 may be coupled together using thermal grease, solder, sinter material, or brazing. Besides providing a pathway for extraction of heat, the heat extraction component 1230 also may be coupled to system ground, and thus the heat extraction component 1230 may serve as a system ground connection for device 400.

In addition, the conductive interconnects 480 (including interconnects 480-1, 480-2, FIG. 4A) are physically and electrically coupled (e.g., soldered) to the contact pads 1220 at the top surface 1212 of the system substrate 1210. Accordingly, the system substrate 1210 enables RF input signals to be provided to device 400 through one of the contact pads 1220, RF output signals to be received from device 400 through another one of the contact pads 1220, and additional bias and ground connections to be established between the system substrate 1210 and the device 400 through other contact pads and device interconnects (not shown).

The embodiments of devices 400, 400', 500, 600, 700, 900, 900', 1000 depicted in FIGS. 4A-C, 5-7, 9A-C, and 10 provide for bottom-side cooling of devices 400, 400', 500, 600, 700, 900, 900', 1000. In a bottom-side cooled system, such as that depicted in FIG. 12, the heat extraction path for the dies 430, 930, 931 within each device 400, 400', 500, 600, 700, 900, 900', 1000 extends through the system substrate 1210.

If devices 400, 400', 500, 600, 700, 900, 900', 1000 were slightly modified, each device could instead be incorporated into a top-side cooled system. For example, FIG. 13 is a side, cross-sectional view of another embodiment of a power amplifier device 900" (similar to the cross-section of FIG. 9B) coupled to a system substrate 1310 in a system with top-side heat extraction, according to an example embodiment.

Figure 13:
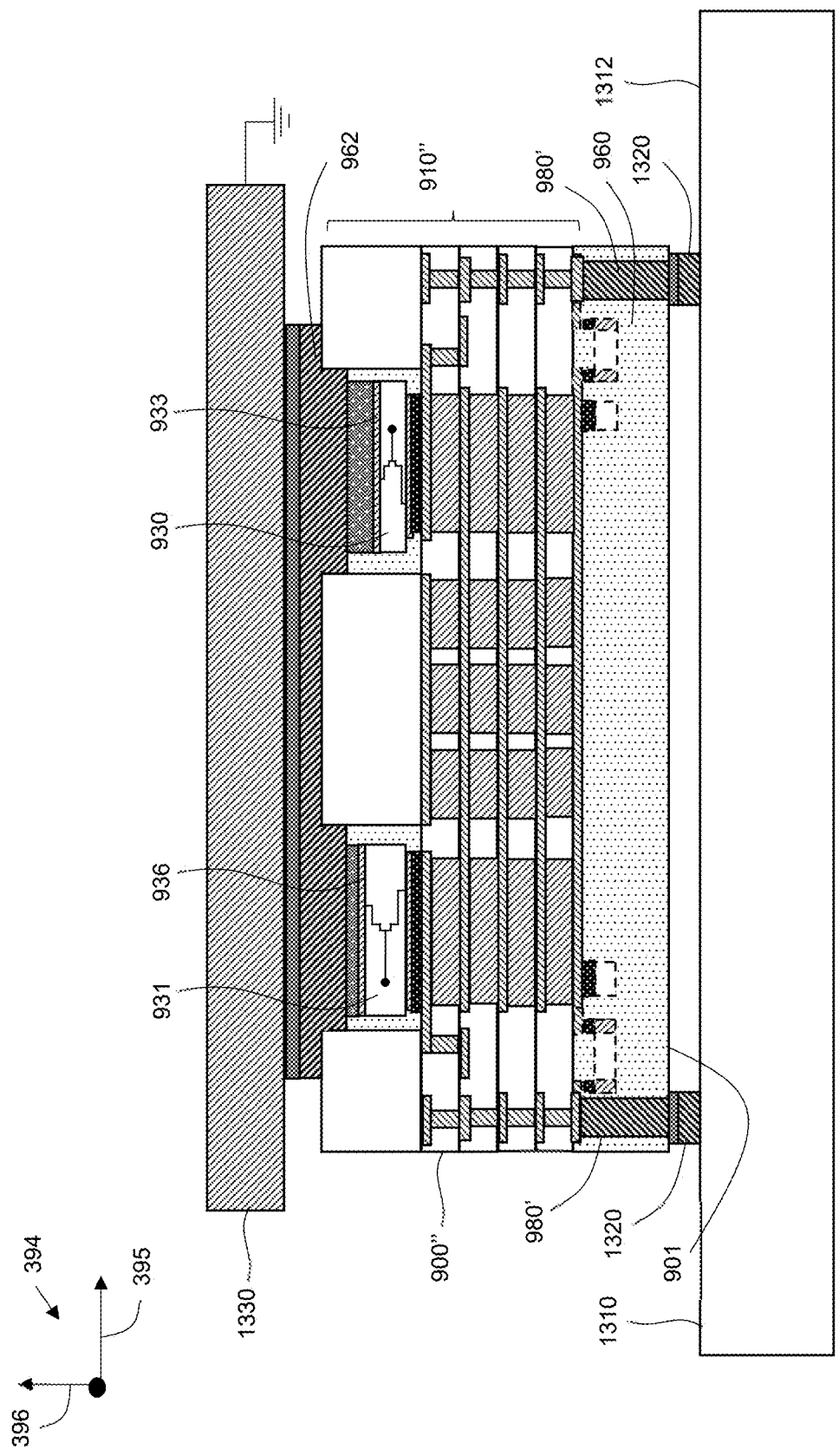
FIG. 13 is a side, cross-sectional view of another embodiment of a power amplifier device coupled to a system substrate with top-side heat extraction, according to an example embodiment.

Device 900" shown in FIG. 13 is slightly different from device 900 in FIGS. 9A-B to facilitate incorporation into a top-side cooled system. In particular, and referring to FIG. 9B, device 900 includes conductive interconnects 980 (e.g., 980-3) that extend through though a layer 913 that partially defines the lower surface 902 of the device 900. Thus, the conductive interconnects 980 and the thermal structure 962 both are exposed at the lower surface 902 of the device 900.

In contrast, and referring to FIG. 13, in modified power amplifier device 900", conductive interconnects 980', which function as I/O terminals for the device 900", instead are coupled to surface 912 of device substrate 910", and the interconnects 980' extend through the encapsulation material layer 960 that defines surface 901 of the device 900" (i.e., surface 901 is the "contact surface" of device 900"). Additional conductive interconnects (not shown) for RF I/O, bias, and ground connection also may extend through the encapsulation material layer 960. In other words, in device 900", the conductive interconnects 980' are exposed at an opposite surface of device 900" than the surface at which the thermal structure 962 is exposed. The conductive interconnects 980' are electrically coupled through the device substrate to the various dies 930, 931 and surface mount components 971, 972 as discussed above in conjunction with FIGS. 9A-C. It should be noted here that power amplifier devices 400, 400', 500, 600, 700, 900', 1000 may be similarly modified and coupled to a system substrate in a manner that enables top side cooling.

Again, the system substrate 1310 may be, for example, a PCB with a plurality of contact pads 1320 at a top surface 1312. Although not shown in FIG. 13, the contact pads 1320 may be electrically coupled through additional traces on the substrate 1310 to other system components.

Device 900" is physically and electrically coupled to the system substrate 1310. More particularly, and according to an embodiment, the conductive interconnects 980' (and other interconnect, not shown) are physically and electrically coupled (e.g., soldered) to the contact pads 1320 at the top surface 1312 of the system substrate 1310. Accordingly, the system substrate 1310 enables RF input signals to be provided to device 900" through one of the contact pads 1320, RF output signals to be received from device 900" through another one of the contact pads 1320, and additional bias and ground connections to be established between the system substrate 1310 and the device 900" through still other contact pads and device interconnects (not shown).

In the orientation shown in FIG. 13, the thermal structure 962 of device 900" is facing upward away from the system substrate 1310. According to an embodiment, a heat extraction component 1330 (e.g., a heat sink or conductive plate) is physically, electrically, and thermally coupled to the thermal structure 962 of device 900". For example, thermal structure 962 and heat extraction component 1330 may be coupled together using thermal grease, solder, sinter material, or brazing. Besides providing a pathway for extraction of heat, the heat extraction component 1330 also may be coupled to system ground, and thus the heat extraction component 1330 may serve as a system ground connection for device 900". In other embodiments, to ensure adequate RF grounding, other grounding structures may be implemented within device 900" (e.g., by providing a conductive pathway through the substrate 910" between conductive layers 933, 936 and a device terminal 980' coupled to system ground), or on the exterior surface of device 900" (e.g., by providing a conductive pathway extending along the sides of substrate 910" and layer 960 that electrically couples layers 933, 936 to a ground contact on the system substrate 1310).

An embodiment of a power amplifier device includes a power transistor die with a bondpad that is exposed at a contact surface of the power transistor die, and an integrated transistor with a terminal coupled to the bondpad. The bondpad has a bondpad length that is elongated along a first axis that is parallel to the contact surface. The device also includes a substrate formed from a stack of multiple dielectric layers and multiple patterned conductive layers in an alternating arrangement, and a plurality of conductive vias electrically coupling portions of the multiple patterned conductive layers. The substrate is defined by a first substrate surface and a second substrate surface, and the substrate includes a die contact that is exposed at the first substrate surface and elongated along a second axis that is parallel to the first axis. The die contact is attached to the first bondpad to provide a uniform connection between the die contact along the bondpad length of the first bondpad. The substrate also includes a vertical interconnect structure connected to the first die contact and extending towards the second substrate surface. The vertical interconnect structure extends in a direction that is perpendicular to the first substrate surface. A first circuit including at least one passive component is coupled to the second substrate surface and electrically coupled to the vertical interconnect structure. A first encapsulation material layer covers the passive component(s) and the second substrate surface and defines a first device surface. A plurality of device interconnects are coupled to the substrate, electrically coupled to the power transistor die, and exposed at a contact surface of the power amplifier device.

Another embodiment of a power amplifier device includes first and second power transistor dies and a substrate. The first power transistor die includes a first bondpad that is exposed at a contact surface of the first power transistor die, and a first integrated transistor that includes a first terminal coupled to the first bondpad. The first bondpad has a bondpad length that is elongated along a first axis that is parallel to the contact surface. The second power transistor die includes a second bondpad that is exposed at a contact surface of the second power transistor die, and a second integrated transistor that includes a first terminal coupled to the second bondpad.

The substrate is formed from a stack of multiple dielectric layers and multiple patterned conductive layers in an alternating arrangement, and a plurality of conductive vias electrically coupling portions of the multiple patterned conductive layers. The substrate is defined by a first substrate surface and a second substrate surface, and the substrate includes first and second die contacts and a vertical interconnect structure. The first die contact is elongated along the first axis and is exposed at the first substrate surface. The first die contact is attached to the first bondpad to provide a uniform connection between the first die contact along the bondpad length of the first bondpad. The second die contact is exposed at the first substrate surface and is attached to the second bondpad. The vertical interconnect structure is connected to the first die contact and extends toward the second substrate surface in a direction parallel to a second axis that is perpendicular to the first axis. The vertical interconnect structure includes at least one via of the plurality of conductive vias interleaved with multiple conductive layer portions formed from the multiple patterned conductive layers.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power amplifier device comprising:
a first device surface;
a second device surface opposite the first device surface;
a power transistor die that includes
a first die surface,
a second die surface opposite the first die surface,
a first bondpad that is exposed at the first die surface, wherein the first bondpad has a bondpad length that is elongated along a first axis that is parallel to the first die surface,
a conductive layer on the second die surface, and
an integrated transistor that includes a gate terminal, a drain terminal, and a source terminal, wherein one of the gate terminal and the drain terminal is electrically coupled within the power transistor die to the first bondpad at the first die surface, and the source terminal is electrically coupled within the power transistor die to the conductive layer on the second die surface;
a substrate formed from a stack of multiple dielectric layers and multiple patterned conductive layers in an alternating arrangement, and a plurality of conductive vias electrically coupling portions of the multiple patterned conductive layers, wherein the substrate is defined by a first substrate surface and a second substrate surface opposite the first substrate surface, and wherein the substrate includes
a first die contact that is exposed at the first substrate surface and elongated along a second axis that is parallel to the first axis, wherein the first die contact is attached to the first bondpad of the power transistor die to provide a uniform connection between the first die contact and the first bondpad along the bondpad length of the first bondpad, and
a vertical interconnect structure connected to the first die contact and extending from the first die contact towards the second substrate surface, wherein the vertical interconnect structure is located between the first and second substrate surfaces, and the vertical interconnect structure extends from the first die contact in a direction that is perpendicular to the first substrate surface;
a first circuit on the second substrate surface and including at least one passive component that is connected to substrate contacts that are exposed at the second substrate surface, wherein the substrate contacts and the first circuit are electrically coupled to the vertical interconnect structure; and
a plurality of device interconnects coupled to the substrate, wherein at least some of the plurality of device interconnects are electrically coupled to the gate and drain terminals of the power transistor die, at least one of the plurality of device interconnects is electrically coupled to the vertical interconnect structure, and each of the plurality of device interconnects have distal ends that are exposed at the second device surface.

2. The power amplifier device of claim 1, wherein:
the bondpad length of the first bondpad is at least five times greater than a bondpad width.

3. A power amplifier device comprising:
a first device surface;
a second device surface opposite the first device surface;
a first power transistor die that includes
a first die surface,
a second die surface opposite the first die surface, a first bondpad that is exposed at the first die surface, wherein the first bondpad has a bondpad length that is elongated along a first axis that is parallel to the first die surface, a conductive layer on the second die surface, and a first integrated transistor that includes a gate terminal, a drain terminal, and a source terminal, wherein one of the gate terminal and the drain terminal is electrically coupled within the power transistor die to the first bondpad at the first die surface, and the source terminal is electrically coupled within the power transistor die to the conductive layer on the second die surface;

a second power transistor die that includes a second bondpad that is exposed at a contact surface of the second power transistor die, and a second integrated transistor that includes a first terminal coupled to the second bondpad;

a substrate formed from a stack of multiple dielectric layers and multiple patterned conductive layers in an alternating arrangement, and a plurality of conductive vias electrically coupling portions of the multiple patterned conductive layers, wherein the substrate is defined by a first substrate surface and a second substrate surface opposite the first substrate surface, and wherein the substrate includes a first die contact that is elongated along the first axis and exposed at the first substrate surface, wherein the first die contact is attached to the first bondpad of the first power transistor die to provide a uniform connection between the first die contact and the first bondpad along the bondpad length of the first bondpad, a second die contact exposed at the first substrate surface and attached to the second bondpad, and a vertical interconnect structure connected to the first die contact and extending from the first die contact toward the second substrate surface in a direction parallel to a second axis that is perpendicular to the first axis, wherein the vertical interconnect structure is located between the first and second substrate surfaces, and the vertical interconnect structure includes at least one via of the plurality of conductive vias interleaved with multiple conductive layer portions formed from the multiple patterned conductive layers;

a first circuit on the second substrate surface and including at least one passive component that is connected to substrate contacts that are exposed at the second substrate surface, wherein the substrate contacts and the first circuit are electrically coupled to the vertical interconnect structure; and a plurality of device interconnects coupled to the substrate, wherein at least some of the plurality of device interconnects are electrically coupled to the gate and drain terminals of the power transistor die, at least one of the plurality of device interconnects is electrically coupled to the vertical interconnect structure, and each of the plurality of device interconnects have distal ends that are exposed at the second device surface.

4. The power amplifier device of claim 3, further comprising:

a first encapsulation material layer covering the at least one passive component and the second substrate surface and defining the first device surface.

5. The power amplifier device of claim 1, further comprising:

a first encapsulation material layer covering the at least one passive component and the second substrate surface and defining the first device surface.

6. The power amplifier device of claim 5, further comprising:

a second encapsulation material layer covering the power transistor die and the first substrate surface, wherein the second encapsulation material layer defines the second device surface.

7. The power amplifier device of claim 1, wherein the vertical interconnect structure comprises:

a stack of multiple elongated vias of the plurality of conductive vias; and multiple elongated conductive layer portions formed from the multiple patterned conductive layers and interleaved with the multiple elongated vias.

8. The power amplifier device of claim 7, wherein the multiple elongated vias and the multiple elongated conductive layer portions are aligned along the second axis.

9. The power amplifier device of claim 7, further comprising:

an input/output (I/O) contact of the plurality of device interconnects; and an I/O conductor with an elongated proximal end connected to one of the multiple elongated conductive layer portions of the vertical interconnect structure, and a distal end electrically coupled to the I/O contact, wherein the I/O conductor is formed from a same patterned conductive layer as the one of the multiple elongated conductive layer portions, and the I/O conductor extends in a direction that is perpendicular to the vertical interconnect structure and the I/O conductor electrically connects the I/O contact to the vertical interconnect structure.

10. The power amplifier device of claim 9, further comprising:

at least one impedance matching component electrically coupled along the I/O conductor between the vertical interconnect structure and the I/O contact.

11. The power amplifier device of claim 1, wherein the first circuit comprises:

a conductive path formed from portions of an uppermost patterned conductive layer, wherein the conductive path has a proximal portion that is electrically connected to the vertical interconnect structure, and a distal portion that is electrically connected to a first device interconnect of the multiple device interconnects; and the at least one passive component coupled along the conductive path.

12. The power amplifier device of claim 11, wherein the proximal portion of the conductive path extends in a direction that is perpendicular to the vertical interconnect structure.

13. The power amplifier device of claim 11, wherein the proximal portion of the conductive path extends from an end of the one of the multiple elongated conductive layer portions in a direction parallel to the first axis.

14. The power amplifier device of claim 11, wherein the at least one passive component comprises:

a discrete inductor connected to the second substrate surface; and a discrete capacitor connected to the second substrate surface in series with the discrete inductor.

15. The power amplifier device of claim 11, wherein the at least on passive component comprises:

a radial stub coupled along the conductive path and formed from one or more portions of the multiple patterned conductive layers.

16. The power amplifier device of claim 11, wherein:
the at least one passive component includes an inductance and a capacitor coupled in series along the conductive path to form a series inductor-capacitor (LC) circuit configured to perform a function selected from a harmonic termination circuit and a shunt-L circuit.

17. The power amplifier device of claim 1, wherein:
the second die surface is recessed below the second device surface; and
the power amplifier device further includes a thermal structure contacting the second die surface.

18. The power amplifier of claim 3, wherein:
the first bondpad is an output bondpad for the first power transistor die, and the first bondpad is electrically coupled to the drain terminal of the first integrated transistor; and
the second bondpad is an output bondpad for the second power transistor die, and the second terminal is a drain terminal of the second integrated transistor.

19. The power amplifier device of claim 3, wherein the vertical interconnect structure comprises:
a stack of multiple elongated vias of the plurality of conductive vias; and
multiple elongated conductive layer portions formed from the multiple patterned conductive layers and interleaved with the multiple elongated vias.

20. The power amplifier device of claim 3, further comprising:
an impedance inverter formed from a portion of one of the multiple patterned conductive layers and having a first end coupled to the first die contact and a second end coupled to the second die contact.

21. The power amplifier device of claim 3, wherein:
the first power transistor forms a portion of a peaking amplifier of a Doherty amplifier;
the second power transistor forms a portion of a carrier amplifier of the Doherty amplifier; and
the first die contact corresponds to a combining node of the Doherty power amplifier.

22. The power amplifier device of claim 3, wherein:
the first power transistor forms a portion of a carrier amplifier of a Doherty amplifier;
the second power transistor forms a portion of a peaking amplifier of the Doherty amplifier; and
the first die contact corresponds to a combining node of the Doherty power amplifier.

* * * * *